United States Patent
Shindo et al.

(10) Patent No.: US 6,511,575 B1
(45) Date of Patent: Jan. 28, 2003

(54) TREATMENT APPARATUS AND METHOD UTILIZING NEGATIVE HYDROGEN ION

(75) Inventors: Haruo Shindo, Atsugi; Hideo Kitagawa, Utsunomiya; Masakazu Furukawa, Yokohama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/437,336

(22) Filed: Nov. 10, 1999

(30) Foreign Application Priority Data

Nov. 12, 1998 (JP) .......................................... 10-321978
Apr. 27, 1999 (JP) .......................................... 11-120207
Apr. 27, 1999 (JP) .......................................... 11-120208

(51) Int. Cl.$^7$ ................................................ H05H 1/00
(52) U.S. Cl. .............. 156/345; 204/298.34; 204/298.36
(58) Field of Search .................. 156/345; 118/723 ME, 118/723 ER, 723 E, 723 HC; 204/298.04, 298.36, 298.34

(56) References Cited

U.S. PATENT DOCUMENTS

| 5,453,305 | A  | * | 9/1995 | Lee ...................... 118/723 MR |
| 6,051,151 | A1 | * | 4/2001 | Keller et al. ................. 156/345 |
| 6,217,703 | B1 | * | 4/2001 | Kitagawa ..................... 156/345 |

FOREIGN PATENT DOCUMENTS

| JP | 05-259124 | * | 10/1993 |
| JP | 07-122539 |   | 5/1995  |
| JP | 07-142020 |   | 6/1995  |
| JP | 07-226387 |   | 8/1995  |
| JP | 08-181125 |   | 7/1996  |
| JP | 08-298288 |   | 11/1996 |
| JP | 09-082689 |   | 3/1997  |

OTHER PUBLICATIONS

Peart, et al. "Measured cross sections for the formation of $H^-$ by collisions between $H^{+3}$ ions and electrons", *Journal of Physics B: Atomic and Molecular Physics*, vol. 12, No. 20, 1979; pp. 3441–3443.

Mizutani, et al. "Sputtering yield and radiation damage by neutral beam bombardment" *Journal of Vacuum Science & Technology A*, vol. 6, No. 3, May/Jun. 1988; pp. 1417–1420.

* cited by examiner

Primary Examiner—Thi Dang
(74) Attorney, Agent, or Firm—Fitzpatrick, Cella, Harper & Scinto

(57) ABSTRACT

In order to eliminate a contact hole of a semiconductor substrate, a polymer dreg after ashing of all inside of a via hole is conducted, or an oxide layer on a barrier metal surface, hydrogen gas is changed to a hydrogen radical, the radical is primarily changed to a negative hydrogen ion, and the ion is introduced onto a wafer arranged in a vacuum container. In this manner, cleaning is done by assisting a negative hydrogen ion having its less generated secondary electrons without imparting plasma damage to an element.

23 Claims, 24 Drawing Sheets

(S31)

(S32)

(S33)

(S34)

(S35)

(S36)

(S37)

(S38)

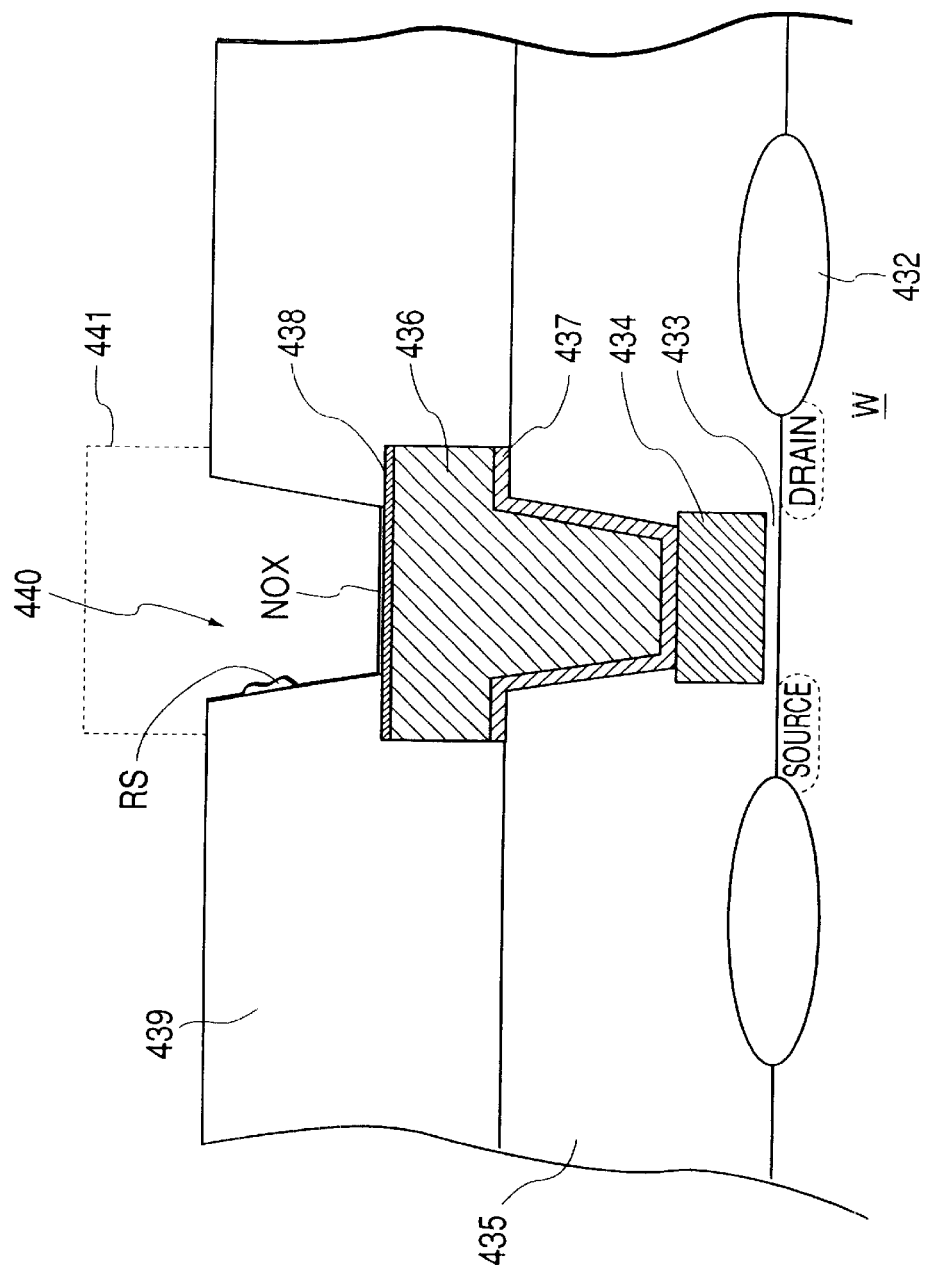

TREATMENT APPARATUS AND METHOD UTILIZING NEGATIVE HYDROGEN ION

BACKGROUND OF THE INVENTION

1. Field of the Invention

The present invention relates to a treating apparatus and method for treating a surface of an object such as etching, ashing, cleaning, surface-reforming or the like. In particular, the present invention pertains to a technical field of a treating apparatus and method for carrying out surface treatment of a surface of an object by employing a negative hydrogen ion. Further, the present invention pertains to a technical field of a method for manufacturing a semiconductor device for surface-treating the inside of a groove such as a contact hole or the like, or a surface to be treated consisting of electric conductors in a wiring (electrode) forming step in a manufacturing process of the semiconductor device, and then, depositing the conductor on the inside of the groove or on the surface of the conductor.

2. Related Background Art

In a surface treatment such as conventional plasma etching, a positive ion has been utilized.

In FIG. 30, there is shown a cross section of a conventional parallel flat-plate type plasma treating apparatus. In FIG. 30, reference numeral 201 denotes a high-frequency power source; reference numeral 202 denotes support means compatible with an electrode to which a high-frequency power is applied; W denotes a semiconductor substrate as an object; IS denotes an ion sheath; PM denotes plasma; reference numeral 206 denotes a vacuum container; reference numeral 205 denotes a grounded opposite electrode; reference numeral 203 denotes a process gas introducing inlet; and reference numeral 204 denotes an air exhaust port. In this apparatus, when a high frequency is applied to the support means 202, plasma PM is generated between the support means and an opposite electrode installed in parallel to a substrate. At this time, between the plasma and the support means 202 and between the plasma and the vacuum container 206, an electron depletion area called an ion sheath "IS" is generated due to a difference in easiness of movement of the ion and electron in the plasma, and the plasma becomes a positive potential to the electrode on average. In the support means 202, to which a high frequency is applied, a potential difference against the plasma is greater than the grounded opposite electrode 205, and some hundreds of volts are produced at maximum. A positive ion in the plasma is accelerated by a potential of such a sheath, and the accelerated ion is incident with a certain energy. A substrate surface is etched and cleaned utilizing this positive ion. In a process for manufacturing the semiconductor device, only the positive ion is utilized as described above, and a negative ion is not utilized. However, recently, attention has focused on the negative ion in plasma processing, and there have been proposed some plasma treatment methods utilizing a negative ion.

For example, in Japanese Patent Application Laid-Open No. 8-181125, there is disclosed a plasma etching treatment in which a substrate surface is alternately irradiated with positive and negative oxygen ions utilizing an after-grow plasma of oxygen in order to ensure electrification with a substrate.

In addition, in Japanese Patent Application Laid-Open No. 9-82689, there is disclosed a plasma treating apparatus for treating a substrate by neutral active particles without employing electrified particles such as ions. Similarly, in T. Mizutani and S. Nishimatsu; "Sputtering Yield and Radiation Damage by Neutral Beam Bombardment", J. Vac. Sci. & Technol., Vol. A6, p1417, (1988), there is disclosed plasma treatment using neutral particles.

Further, in Japanese Patent Application Laid-Open No. 7-122539, there is disclosed a surface treatment method for supplying negative fluorine ion beams of 20 eV or less to a hydrogen dissociated and adsorbed silicon oxide, and etching the silicon oxide.

Plasma cleaning treatment as well as plasma etching are applied to a semiconductor device manufacturing process. In the semiconductor device, when a connection between an impurities diffusion layer formed on a surface side of a substrate and a metal wiring layer is made via a contact hole provided at an insulation layer, an aspect ratio of the contact hole (depth/aperture dimensions) greatly exceeds 1. Therefore; as a method for forming a wiring metal film in the contact hole, there is used a sputter method, and as a method for embedding the contact hole even if the aspect ratio is 2 or more, there is used a chemical air phase growth method (CVD method). Tungsten, aluminum, copper, gold or the like are considered for embedding metal into a fine contact hole using the CVD) method. With respect to aluminum, a high-quality film and a high filling speed are achieved with a heat CVD method using DMAH (dimethyl aluminum hydride) and hydrogen, and attention is focused on it as a material for embedding the contact hole, which is the second best to tungsten.

An aluminum wire forming process with the CVD method is carried out as follows: First, after a contact hole has been formed on an insulation film by dry etching and a backing conductive film such as titanium nitrate, called a barrier metal, is formed on a whole substrate surface, including the inside of the contact hole and the insulation film surface. Next, in the case of a contaminating substance on the surface of the barrier metal (for example, titanium barrier metal), cleaning is carried out using plasmas in order to eliminate titanium oxides. Further, a substrate is carried into a CVD chamber without being exposed to atmosphere, and an aluminum film is deposited using DMAH and hydrogen.

Here, in plasma cleaning before depositing aluminum, there are known a method for sputtering a barrier metal surface using inert gas plasmas such as argon, a method for etching a barrier metal surface using plasmas of halogen gas such as chlorine (refer to Japanese Patent Application Laid-Open No. 7-226387), and a method for reducing and eliminating a natural oxide film on a barrier metal surface using hydrogen plasmas (refer to Japanese Patent Application Laid-Open No. 8-298288).

In a conventionally employed positive ion treatment, a positive electric charge is accumulated on a surface of an object during treatment, and the surface potential of the object is electrified with a high positive potential. Even if neutral particles are used, secondary electron emission due to energy shock of neutral particles incident to the object takes place in similar fashion, the surface of the object is positively charged. Even during alternate irradiation of positive and negative ions, although the extent of the electric charge is less than that of only a positive ion treatment, secondary electron emission due to positive ion incidence is not eliminated. Thus, the surface is charged with a high positive potential.

In addition, in cleaning of the conductor surface, oxides cannot be fully eliminated by negative oxygen ions considering metal properties such as continuously deposited aluminum or backing conductor properties. In negative halogen ions, a new design is required for preventing conductor corrosion due to the residual halogen. Even if hydrogen is used, since positive hydrogen ions are primarily used for a conventional plasma treatment, the aforementioned electrification problem will occur.

In particular, when a surface has a groove, specifically, when the surface has irregularities caused by etching patterns or the like, a groove shape failure or a cleaning failure in the groove will often occur.

Thus, charge damage due to charging will occur in the conventional method.

SUMMARY OF THE INVENTION

It is an object of the present invention to provide a treating apparatus and method in which damage due to charging is suppressed, and a surface can be surface-treated in a proper state.

It is another object of the present invention to provide a method for manufacturing a semiconductor device in which damage due to electrification is suppressed, and a proper electronic contact state can be obtained when surface treatment of a surface consisting of electric conductors is treated before the conductor is deposited on the inside of the groove.

According to an aspect of the present invention, there is provided a treating apparatus having:

a container;

a support means for supporting an object to be treated in the container, a gas introducing means for introducing hydrogen gas in the container, and a plasma generating means for generating a plasma of the hydrogen gas, which comprises a drawing means for preferentially drawing a negative hydrogen ion from the plasma to the object to be treated, wherein a hydrogen ion group in a state in which a negative hydrogen ion quantity is more than a positive hydrogen ion quantity is supplied to the object to be treated for treatment.

According to another aspect of the present invention, there is provided a method for treating an object to be treated by using the above-mentioned treating apparatus.

According to another aspect of the present invention, there is provided a treatment method wherein a negative ion generated by the treating apparatus 1 is imparted to an object to be treated, thereby performing surface treatment of the object to be treated.

According to another aspect of the present invention, there is provided a treating apparatus having:

a container;

a support means for supporting an object to be treated in the container;

a gas introducing means for introducing hydrogen gas in the container; and a plasma generating means for generating a plasma of the hydrogen gas, which comprises a metal member for generating a negative hydrogen ion provided so as to come into contact with hydrogen radical and/or positive hydrogen ion generated by the plasma generating means, wherein a hydrogen ion group in a state in which a negative hydrogen ion quantity is more than a positive hydrogen ion quantity is supplied to the object to be treated for treatment.

According to another aspect of the present invention, there is provided a method for treating an object to be treated by using the treating apparatus.

According to another aspect of the present invention, there is provided a treating apparatus having:

a container;

a support means for supporting an object to be treated in the container; and a gas introducing means for introducing hydrogen gas in the container, wherein the treating apparatus has a negative hydrogen ion generating means for generating a negative hydrogen ion from a hydrogen gas introduced from the gas introducing means, wherein a hydrogen ion group in a state in which a negative hydrogen ion quantity is more than a positive hydrogen ion quantity is supplied to the object to be treated for treatment.

According to another aspect of the present invention, there is provided a method for treating an object to be treated by using the treating apparatus.

According to another aspect of the present invention, there is provided a process for fabricating a semiconductor device comprising:

a cleaning process for cleaning an interior face of a groove formed at an insulation film provided on a substrate; and a process for depositing a wiring conductor in the groove, wherein the cleaning process includes the step of supplying into the groove a hydrogen ion group in a state in which a negative hydrogen ion quantity is more than a positive ion quantity to carry out treatment.

According to another aspect of the present invention, there is provided a method for treating a face to be treated comprising:

an electric conductor, the treatment method comprising the process for exposing the face treated to a hydrogen ion group in a state in which a negative hydrogen ion quantity is more than a positive hydrogen ion quantity.

According to another aspect of the present invention, there is provided a process for fabricating a semiconductor device comprising:

a surface treatment process for surface-treating a face to be treated consisting of an electric conductor and a depositing process for depositing an electric conductor on the face to be treated a surface of which has been treated, wherein the surface treatment process includes the step of exposing the face to be treated to a hydrogen ion group in a state in which a negative hydrogen ion quantity is more than a positive hydrogen ion quantity.

According to another aspect of the present invention, there is provided a treating apparatus comprising:

a container for providing a treatment space and a negative ion generating space communicating therewith;

a radical generating space communicating with the negative ion generation space;

an electron supply means connected in the negative ion generation space;

a support means for installing an object to be treated in the treatment space; and means for supplying the negative ion into the object to be treated.

According to another aspect of the present invention, there is provided a process for fabricating a semiconductor device comprising the step of: forming an insulation film having a recess portion for forming a wire on an object to be treated, forming a barrier metal on a surface of the insulation film and an inside face of a recess portion and a bottom face of the recess portion, cleaning a surface of the barrier metal, and depositing a wiring metal by a chemical gas phase method, wherein the cleaning step for the barrier metal surface is a cleaning comprised of supplying a negative ion to the object to be treated in a treatment space.

According to another aspect of the present invention, there is provided a treating apparatus comprising:

a hydrogen radical generating portion for generating a hydrogen radical;

a negative hydrogen ion generating portion for generating a negative hydrogen ion from the hydrogen radical; and a container for housing an object to be treated, wherein the negative hydrogen ion comes into contact with the object to be treated.

According to another aspect of the present invention, there is provided a process for fabricating a semiconductor device, comprising the process of cleaning a side wall and a bottom part of a groove of an object to be treated with the negative hydrogen ion by using the treating apparatus.

BRIEF DESCRIPTION OF THE DRAWINGS

FIGS. 21A, 21B, 22C and 22D are views showing a semiconductor device manufacturing process according to a further preferred embodiment of the present invention;

FIG. 27 is a schematic cross section of the semiconductor device according to an Example of the present invention;

DETAILED DESCRIPTION OF THE PREFERRED EMBODIMENTS

Treatment Apparatus

Figure 1:
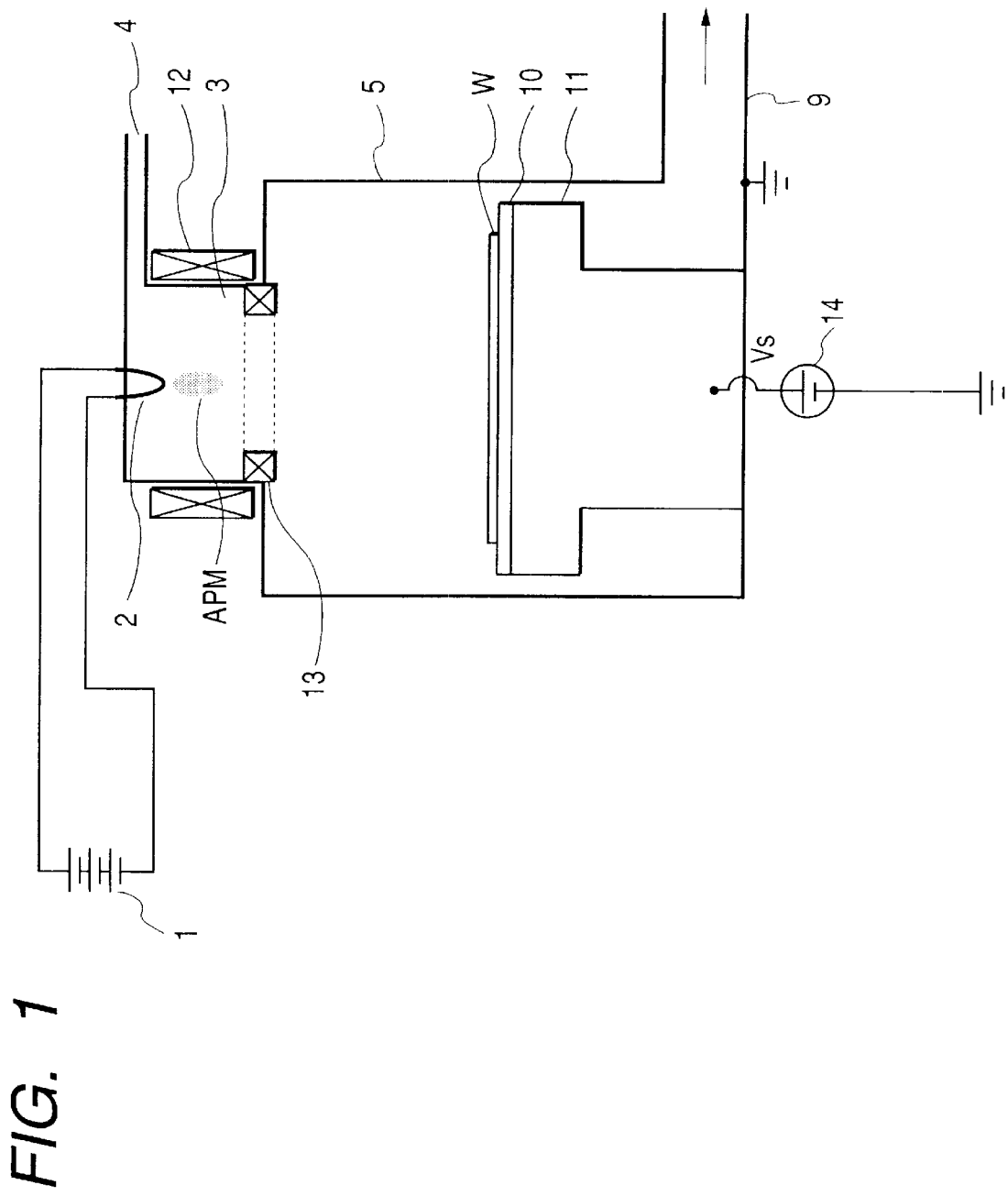
FIG. 1 is a view showing a treating apparatus according to one preferred embodiment of the present invention.

FIG. 1 shows a treating apparatus according to one preferred embodiment of the present invention.

In FIG. 1, as plasma generating means, a DC power source 1 and a filament 2 are provided. Reference numeral 3 denotes a plasma generating chamber in a container that can be pressure-reduced, which is a plasma generating space. Reference numeral 4 denotes a process gas introducing port for a hydrogen gas or the like, and reference numeral 5 denotes a treatment chamber in the container, which is a treatment space of an object to be treated W having a groove. Reference numeral 9 denotes an air exhaust port. Reference numeral 10 denotes an insulation plate provided as required, reference numeral 11 denotes a support base as support means for supporting the object to be treated W in the container, and reference numerals 12 and 13 denote a multi-pole type permanent magnet and a magnetic filter for containing plasma provided as required. Reference numeral 14 denotes bias means for applying a positive bias to the object to be treated W in order to increase a quantity (density) of a negative ion in the vicinity of a surface (treated surface) of the object to be treated W. In FIG. 1, the plasma generating chamber 3 and the treatment chamber 5 are provided in a same container, and air is exhausted from the air exhaust port 9 by means of a vacuum pump (not shown.). In order to achieve a high plasma density and optimal treatment of a substrate treated. the plasma generating chamber 3 and the treatment chamber 5 may be air-exhausted by another vacuum pump.

A gas containing hydrogen or a hydrogen atom is introduced from the process gas introducing port 4 into the plasma generating chamber 3, a pressure is set, for example, to about 1 Pa to 7 Pa, and a current is supplied to a filament 2, thereby causing a low-pressure arc electric discharge Details on a mechanism of generating a negative hydrogen ion are described in Japanese Patent Application Laid-Open No. 7-142020 and Journal of Physics B Vol. 12 (1979), page 3441. According to the above article, a reaction formula associated with generation of a negative hydrogen ion is as follows:

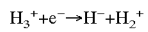

$$H_3^+ + e^- \rightarrow H^- + H_2^+$$

Figure 2:
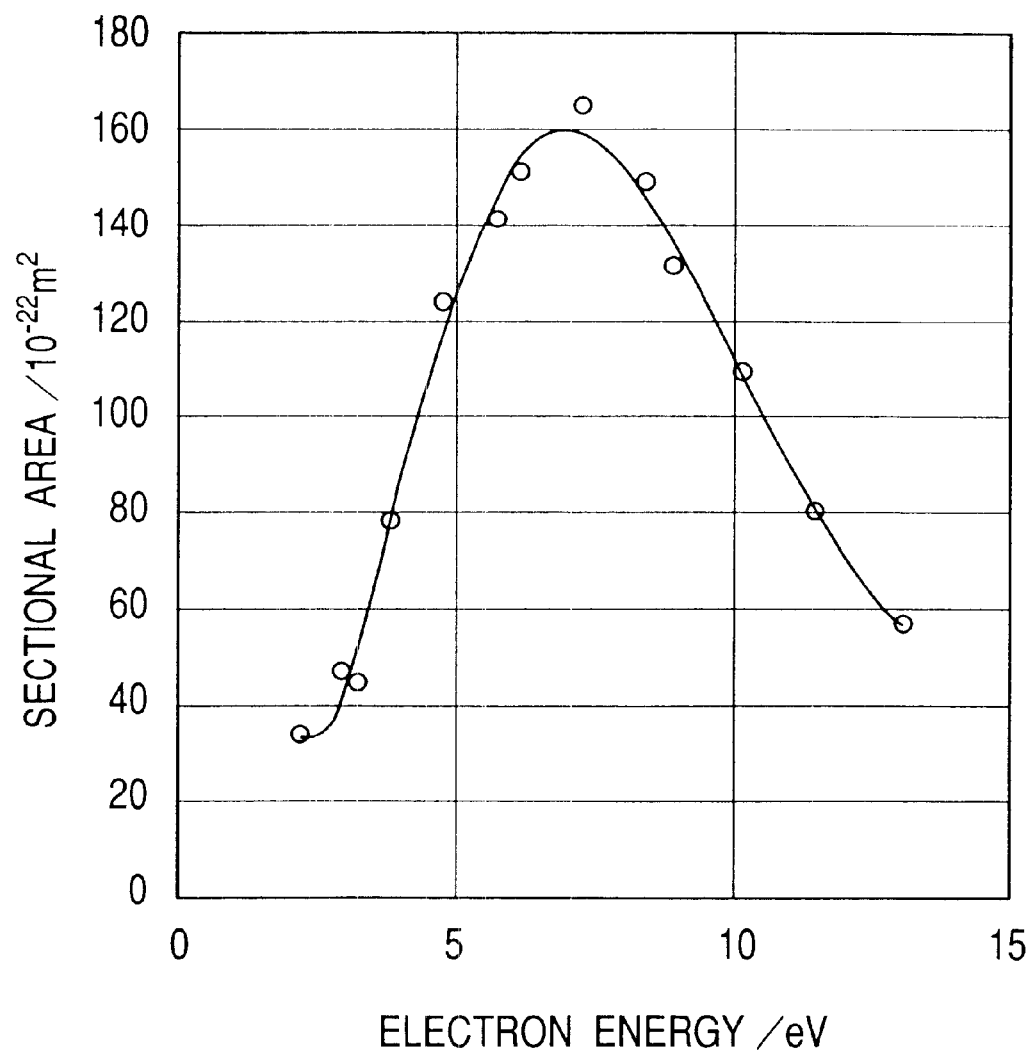
FIG. 2 is a view showing a relationship between a sectional area for adhering and dissociating reactions and an electron energy.

As shown in FIG. 2, according to this article, the sectional area for the above dissociative attachment reaction has a peak where an electron temperature (electron energy) is near 8 eV. In a grow emission plasma used for a general semiconductor manufacturing process, the electron temperature is 2 eV to 5 eV. For effective generation of a negative ion, a plasma of an electron temperature higher than this electron temperature, for example, a plasma of about 6 eV to 9 eV in electron temperature, is required.

Referring to energy distributions of secondary electrons emitted by negative ion incidence, a peak is present at 1 eV to 2 eV, and an electron of an energy higher than the peak suddenly decreases. Thus, electrons of low emission energy, which governs much of the energy distributions, are drawn back to a surface to be treated, and electrons of high emission energy are not drawn back. However, an electrified electric charge due to electrons with high emission energy is offset by a negative ion. A surface potential of an object to be treated from these electric charge balances saturates at a very close value, and enters a normal state.

Therefore, it is important to carry out surface treatment by a hydrogen ion group in which a negative ion quantity (negative ion density) is more than a positive ion quantity (positive ion density). In this case, of course, a 100% negative ion group may be irradiated.

In particular, when negative ion incidence energy is 10 eV or more, secondary electrons not drawn back are reliably emitted, and thus, negative charging can be prevented. In addition, even if incident energy is some tens of eV or more, and two or more secondary electrons are emitted, an effect in which electrons are drawn back to a charged substrate treated is obtained. Thus, a surface potential is stabilized at +5 V to +8 V. Even if the energy is 20 eV or more, the above charging suppression effect is not lost.

In addition to the above, a negative ion provides another advantage in that a temperature of the surface of an object to be treated in which a negative ion is incident is lower than that of a positive ion. This is caused by the fact that a reaction in which the positive ion returns to a neutral atom is a heat generation reaction of 17 eV, whereas a reaction in which the negative ion returns to a neutral atom is a heat absorption reaction of 3 eV. As a result, even if a negative ion is incident to an object to be treated, a local surface temperature in the vicinity of an ion incidence point is lower than that when a position ion is incident. Thus, thermal damage to a substrate, i.e., crystal disturbance, is reduced. As has been described above, by employing a negative ion, there can be achieved proper surface treatment free of electrostatic destruction of a gate oxide film or an abnormal shape due to ion bending and the surface treatment having thermal damage to the object to be treated.

In FIG. 1, there is illustrated a low-pressure arc discharge of a type supplying a direct current to a filament. A similar arc electric discharge can be generated by applying a high frequency. An electric discharge forms for intensively charging power in a small space, other than an arc electric discharge, and includes an ECR electric discharge plasma in which a large amount of power is charged in a low-pressure space or microwave electric discharge plasma using antennas such as slot antenna, radial line slot antenna (RLSA) or the like, for example. When these types of plasma are employed, it is required to select electric discharge conditions such that an electron temperature different from general RF or DC grow electric discharge conditions is about 6 eV to 9 eV.

In addition, it is considered that an electron density increases, and the foregoing reaction is further promoted by adding atoms prone to dissociate electrons during electric discharge. Atoms prone to dissociate electrons include alkali metals such as cesium (Cs) or rubidium (Rb) or alkaline-earth metals such as barium (Ba), strontium (Sr), or calcium (Ca).

Arc electrically discharged plasmas shown in FIG. 1 are plasmas localized and generated in the vicinity of the filament 2. In the case of a substance with its large area, uniformity of treatment is inferior in a single filament. In this case, a plurality of filaments may be installed.

In a method using arc electric discharge, a large amount of thermal electrons other than negative ion are emitted from the filament. To remove electrons from plasmas in which both of the negative ions and electrons are emitted, as shown in FIG. 1, it is desirable that a magnetic filter 113 is installed between the plasma generating chamber 3 and the treatment chamber 5.

When treatment is carried out using the above structured apparatus, neutral particles are not eliminated intentionally, and thus, radicals as particles other than negative ion are incident to a substrate to be treated. However, motion energy of incident radials is very low, and thus, the radicals merely adhere to the surface of the substrate to be treated Thus, a cleaning effect due to spontaneous reaction can hardly be expected. However, when a negative ion having energy is incident to a surface on which hydrogen is adsorbed, a so-called ion assisted reaction occurs. Thus, the reaction velocity is considered to be increased more significantly than that when only a negative ion is incident. That is, the existence of neutral particles, in particular, each radical has an advantage of an increased cleaning velocity, but has few disadvantages, and there is no need to carry out intentional elimination.

In the vicinity of the surface of an object to be treated W arranged in the treatment chamber 5 on the downstream of the plasma generating chamber 3, a negative hydrogen ion quantity (density) is sufficiently greater than a positive hydrogen ion quantity (density) due to a bias voltage.

When the bias voltage is from +50 V to +200 V, preferably about +80 V to +200 V, a negative ion with a density 100 times as high as a positive ion density is obtained in the vicinity of the object to be treated W. The negative ion density can be measured by a commercially available quadrupole mass analyzer or the like.

When a surface is treated in a state in which the quantity of the thus obtained negative ions is greater than that of positive ions, proper surface treatment free of charging is carried out. In particular, this surface treatment is preferable for cleaning a surface consisting of electric conductors treated with negative hydrogen ions or hydrogen termination process, cleaning of the interior face of a groove due to a negative hydrogen ion, and hydrogen termination process or the like.

Figure 3:
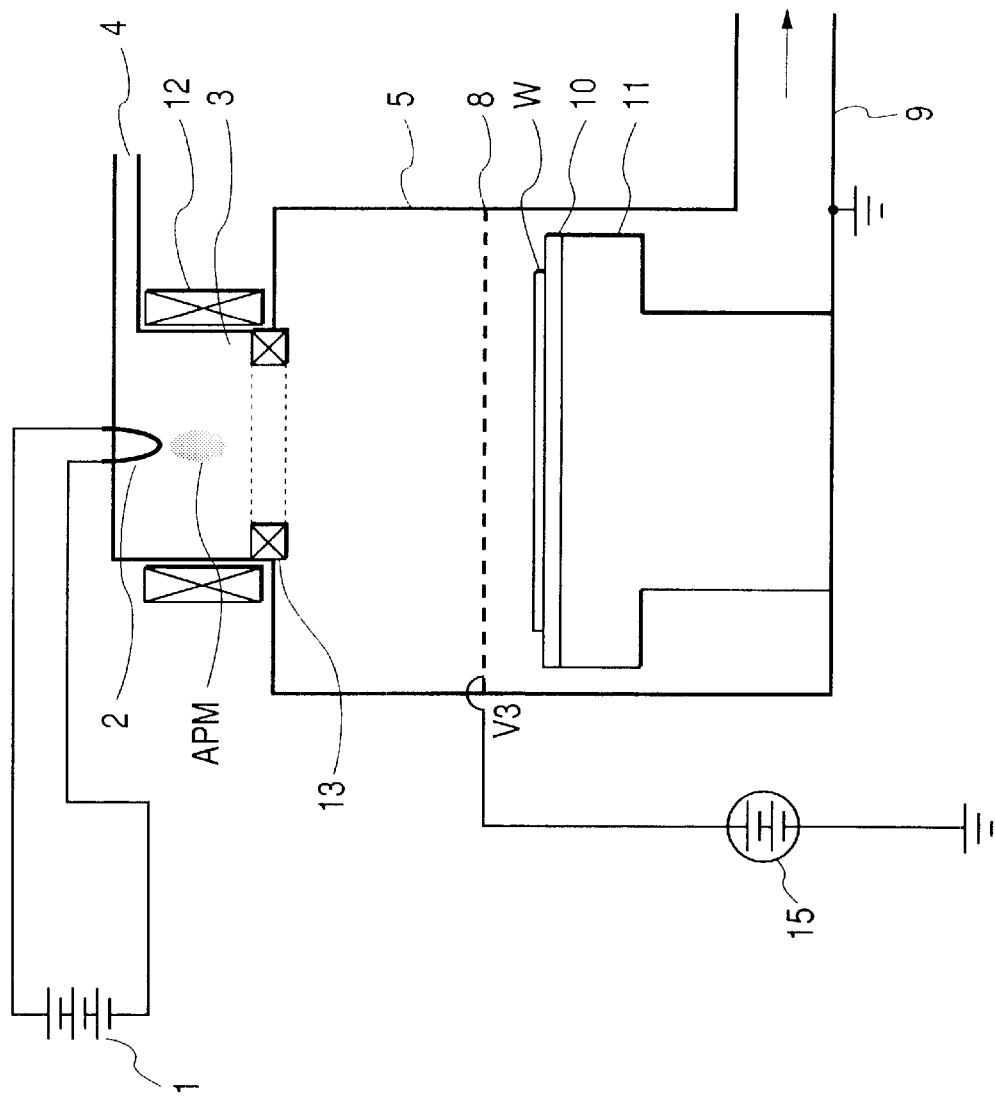
FIG. 3 is a view showing a treating apparatus according to another preferred embodiment of the present invention.
Figure 4:
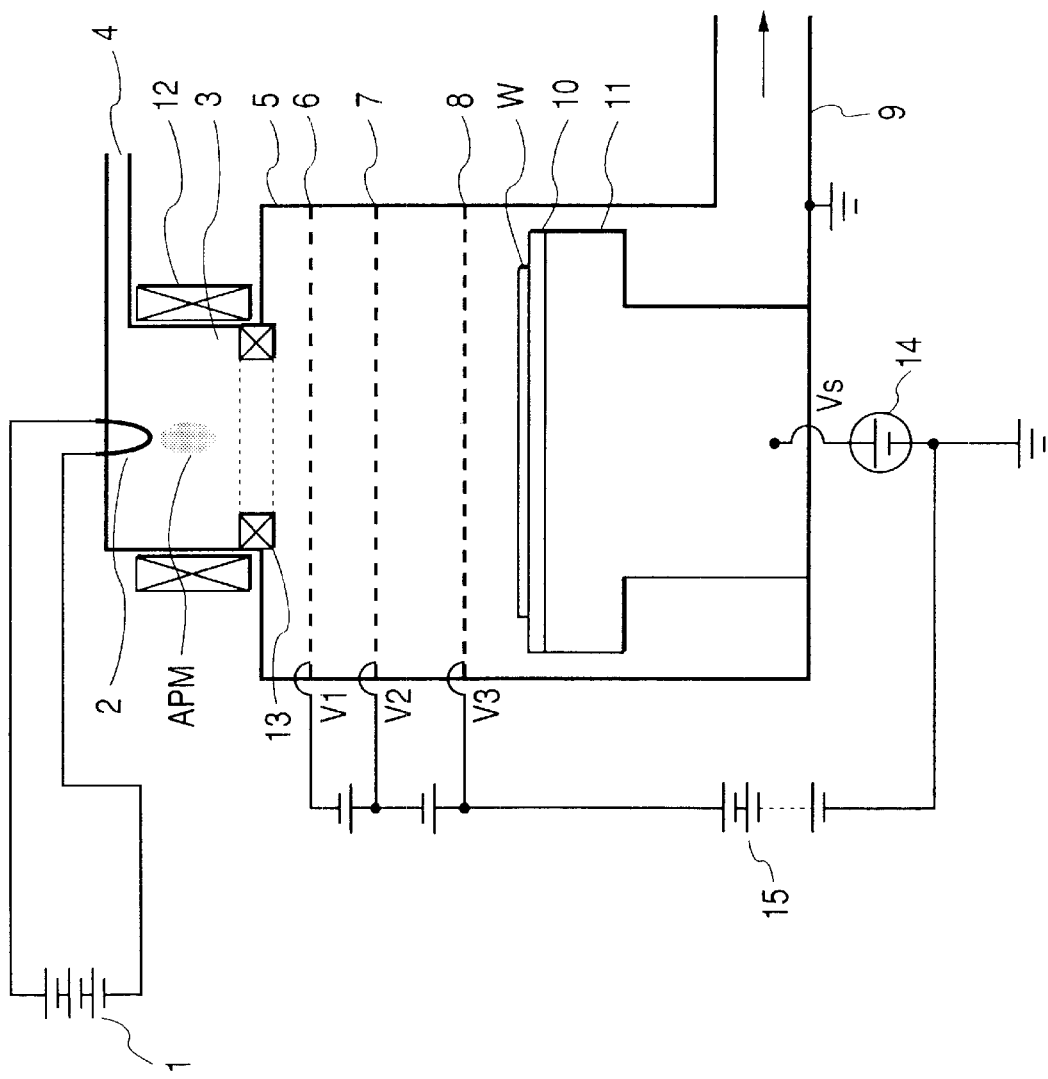
FIG. 4 is a view showing a treating apparatus according to a further preferred embodiment of the present invention.

FIG. 3 shows a treating apparatus according to another preferred embodiment. The treating apparatus shown in FIG. 3 is constructed so that, instead of biasing an object to be treated W having a groove as means for drawing a negative ion from the plasma generating chamber, a grid electrode 8 is provided between the plasma generating chamber and the object to be treated W; a positive DC bias is applied to the grid electrode 8 by means of a power source 45; and the grid electrode is maintained to a positive potential. When a value of +20 V to +200 V or more, preferably a value of about +80 V to +200 V, is selected as a voltage applied to the grid electrode, a negative ion density that is 100 times greater than that of a positive ion can be easily obtained. The apparatus according to the shown embodiment is constructed in a same manner as that shown in FIG. 1, except the construction of negative ion drawing means FIG. 4 shows a treating apparatus according to a further preferred embodiment of the present invention. The treating apparatus shown in FIG. 4 is constructed so that an object to be treated W is biased as means for drawing a negative ion from the plasma generating chamber; a first spare grid 6, a second spare grid 7, and a grid electrode 8 are provided between the plasma generating chamber 3 and the object to be treated W; and a positive DC bias is applied to the first and second grids 6 and 7 and the grid electrode 8 by a power source 15, so as to maintain a positive potential in each grid. The apparatus according to the shown embodiment is constructed in the same manner as shown in FIG. 1, except the construction of negative ion drawing means.

To remove the thus generated negative ions from plasmas containing a large amount of negative ions, positive DC voltages of V1 and V2 are further applied to first and second grids 6 and 7, respectively, so that a condition of V2>V1>Vp>0 is met, wherein Vp denotes a plasma potential, which generally indicates a value of some volts. By such grid electrode arrangement, a negative ion is accelerated to V2–Vp (eV), and is drawn in a vertical direction with respect to two grids. The values of V1 and V2 are adjusted, thereby making it possible to arbitrarily adjust negative ion energy. With respect to a plasma treating apparatus utilizing neutral particles, for example, in Japanese Patent Application Laid-Open No. 9-82689, there is similarly shown a structure having two grids on downstream of the plasma; and however, this structure is different from that of the present invention in that a positive potential is applied to one of the two grids and a negative potential to the other to draw a neutral particle, whereas positive potentials are applied to all of a plurality of grids to draw a negative ion. In addition, in FIG. 4, although there is shown an example of two spare grids installed for drawing a negative ion, only one spare grid will suffice Further, a grid electrode 8 arranged just in front of a support base functions as an electrode for capturing secondary electrons. DC voltages Vs and V3 are applied to the support base 11 and the grid electrode 8, respectively, and a voltage value is set so as to be V3>Vs>0. The thus drawn negative ions from the plasmas have energy of Vs–Vp (eV), and is incident to the object to be treated W. Furthermore, the secondary electrons emitted from the surface of the object to be treated W are accelerated to a potential of V3–Vs and are captured by the grid electrode 8, and excessive negative charge is prevented from accumulating on the surface of the object to be treated W. By adjusting the potentials of V3 and Vs, the incident energy of a negative ion to the object to be treated W and the secondary electron discharge quantity from the surface of the object to be treated can be arbitrarily adjusted.

Thus, the apparatus shown in FIG. 4 can be changed to provide an apparatus in which two spare grids 6 and 7 are removed.

In the case of treating an object on which a transistor having a gate insulation film with its relatively low withstand voltage is formed, when the object to be treated is directly installed on the support base 11, a negative electric charge accumulated on the surface of the object to be treated inflows the support base 11 through a gate oxide film. As a result, the gate oxide film may be destroyed. To prevent this, an insulating plate 10 may be installed between the support base 11 and the object to be treated W. A plate 10 may be composed, for example, of an aluminum oxide, aluminum nitride or the like. However, all materials having insulation properties and high plasma resistance can be applied.

Figure 5:
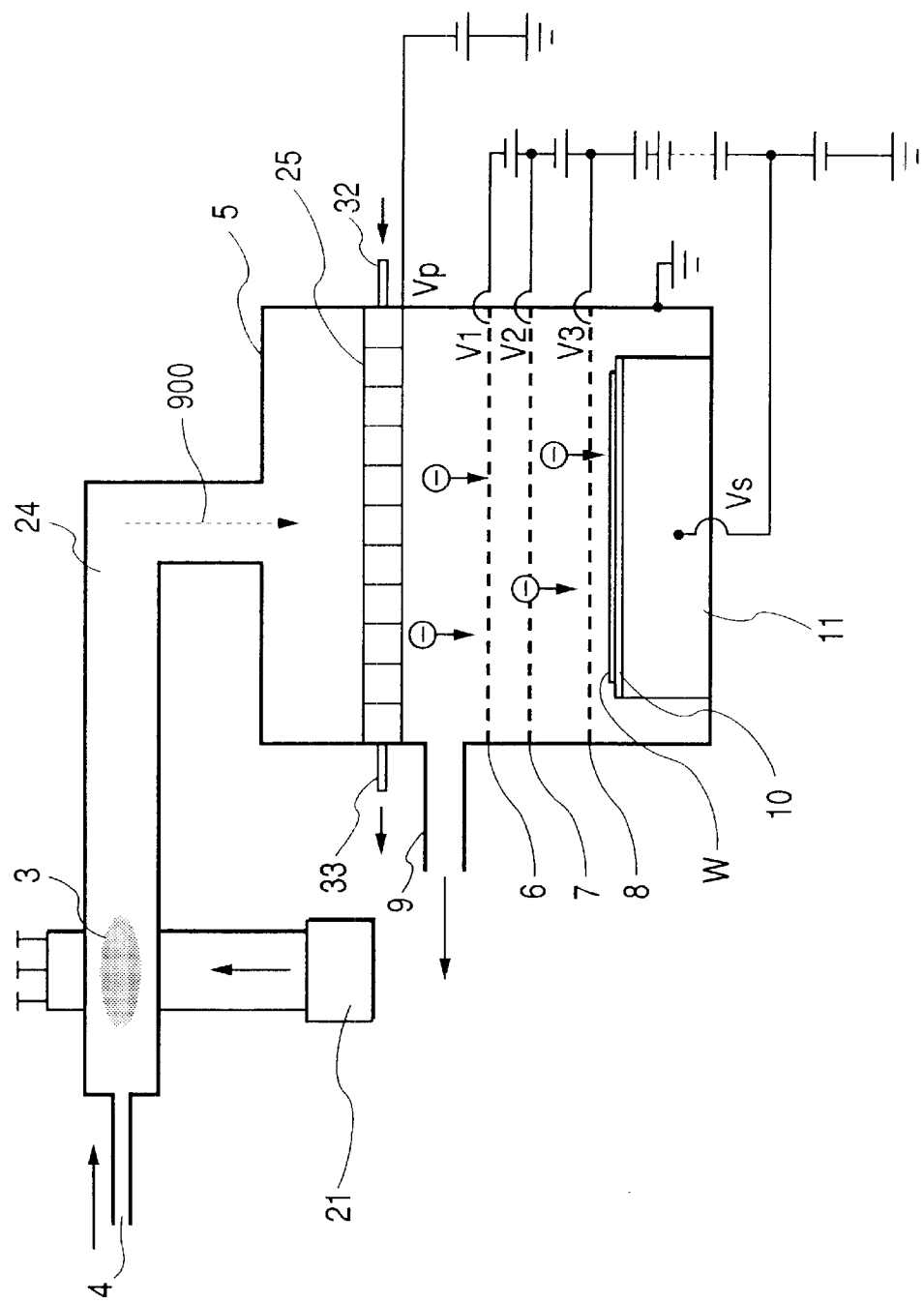
FIG. 5 is a view showing a treating apparatus according to a still further preferred embodiment of the present invention.

FIG. 5 shows a treating apparatus according to another preferred embodiment of the present invention. In this apparatus, neutral active species such as hydrogen radicals are brought into contact with a metal member, thereby generating a large amount of negative hydrogen ions. This apparatus adopts principles of negative ion generation due to a so called charge exchange reaction in which neutral particles receive free electrons in the metal when neutral particles come into contact with the metal surface. In FIG. 5, reference numeral 21 denotes a microwave power source; reference numeral 3 denotes a plasma generating chamber; reference numeral 24 denotes a transport tube; reference numeral 4 denotes a process gas introducing port; reference numeral 5 denotes a treatment chamber; reference numeral 25 denotes a metal plate; reference numeral 6 denotes a first spare grid; reference numeral 7 denotes a second spare grid; reference numeral 8 denotes a grid electrode; reference numeral 10 denotes an insulation plate; 33, a coolant exit; 9, exhaust duct; W, object to be treated; and reference numeral 11 denotes a support base.

First, a gas containing hydrogen or hydrogen atoms is introduced from a gas introducing port 4 into a plasma generating chamber 3, microwaves are supplied by means of a microwave power source 21, and plasmas are generated. As a plasma generating method, there may be employed any type of a parallel flat plate type, ICP type, magnetron type, ECR type, helicon wave type, surface wave surface wave interference type with a flat plate multi-slot antennas, and RLSA type methods. Plasma density should be as high as possible considering a decrease in plasma density when plasmas are diffused in the treatment chamber 5 being a downstream. Next, hydrogen radicals, which are shown as a neutral particle flow 900 in FIG. 5, generated in the plasma generating chamber 3 are transported to the treatment chamber 5 via the transport tube 24. On the other hand, the positive hydrogen ions generated by microwave electric discharge disappear in the middle of transport through recombination with electrons, and a majority of active hydrogen species become neutral active species. Next, a metal member 25 is provided in the treatment chamber 5. With respect to the materials of the metal member 25, at least the surface of the metal member should be composed of materials with their small work functions including alkali metals such as cesium and rubidium or alkaline-earth metals such as barium, calcium and strontium, considering the fact that charge exchange reaction probability increases with a lowered work function of the metal surface. In addition, in order to prevent corrosion of the metal member 25 due to the metal member being exposed to plasmas so as to be at a high temperature cooling should be carried out by coolant such as cooling water as required.

A process in which negative ions are generated is as follows: When neural active species reaching the treatment chamber 5 through the transport tube 24 come into contact with the surface of the metal member 25, so-called charge exchange reaction in which particles receive free electrons in the metal occurs, and the neutral active species are converted into negative ions. At this time, when a negative potential Vp (Vp<0) is applied to the metal member 25, the efficiency of a charge exchange reaction can be improved.

Figure 6:
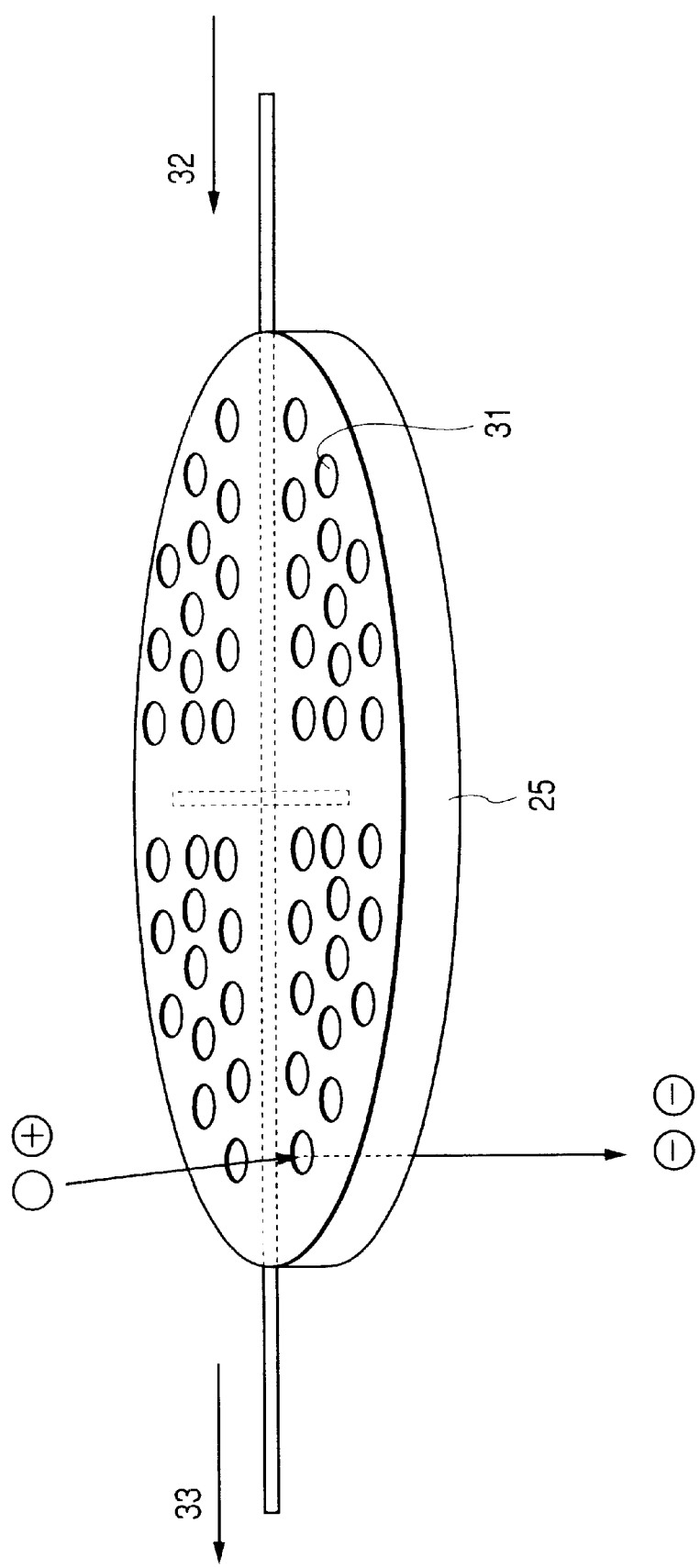
FIG. 6 is a view showing a metal member preferably employed for one preferred embodiment of the present invention.

FIG. 6 shows a metal member preferably employed in a preferred embodiment. Negative hydrogen ions are generated utilizing a charge exchange reaction on the surface of the metal member 25. Thus, the metal member is desirably structured so that a surface area is as great as possible. For instance, FIG. 6 shows a preferred example of a plurality of fine holes 31 drilled on the metal member 25 in number. Reference numeral 32 denotes a coolant entrance for supplying coolant such as cooling water and reference numeral 33 denotes a coolant exit.

In addition to converting neutral active species into negative ions, the positive ions and metal member are employed, thereby making it possible to generate negative ions through the charge exchange reaction. In this case, there is no need for long distance transport of the generated plasmas, and a metal member may be installed in the vicinity of a plasma generating area. In addition, a negative potential Vp (Vp<0) is applied to the metal member 25, and the positive ions are positively drawn in the metal plate, thereby making it possible to further improve the efficiency of the charge exchange reaction.

Figure 7:
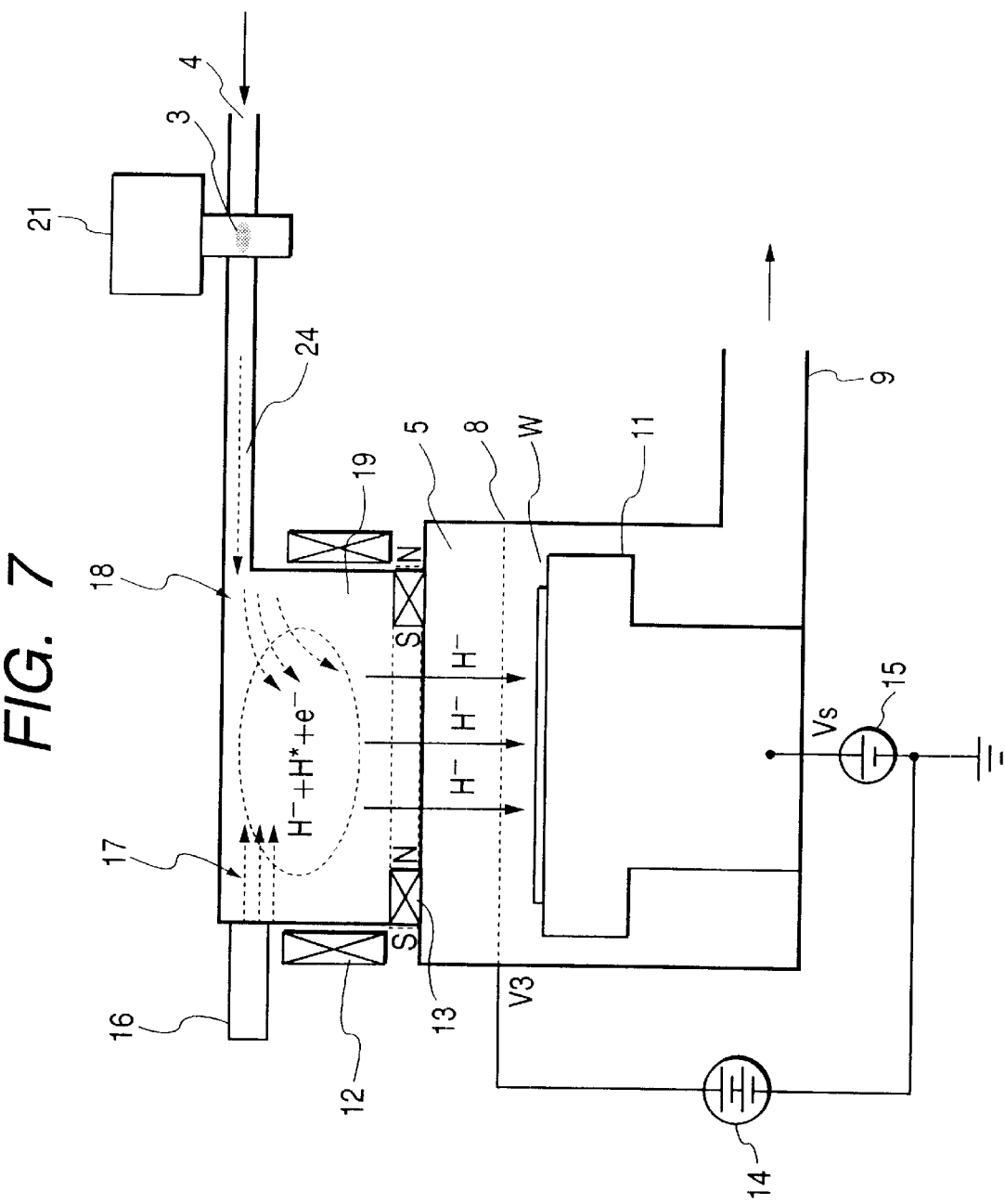
FIG. 7 is a view schematically showing a treating apparatus according to one preferred embodiment of the present invention.

Another treating apparatus and method according to the present invention will be described with reference to FIG. 7. In FIG. 7, reference numeral 21 denotes a microwave power source; reference numeral 3 denotes a process gas introducing port; reference numeral 24 denotes a transport tube; reference numeral 16 denotes an electron supply device; reference numeral 19 denotes a negative ion generating chamber (a generating space); reference numeral 12 denotes a magnet for containing negative ions; reference numeral 13 denotes a magnetic filter; reference numeral 5 denotes an object to be treated treatment chamber (a treatment space); reference numeral 8 denotes a first grid; W denotes an object to be treated; reference numeral 11 denotes a support base; and reference numerals 14 and 15 denote DC power sources.

First, a gas containing hydrogen or hydrogen atoms is introduced from a process gas introducing port 4, a pressure is set to a predetermined value, and power is supplied from a microwave power source 21, thereby generating a microwave-electric discharge plasma 3. Instead of the microwave power source. It is possible to employ a high frequency power source for ICP plasma generation provided with ICP antennas.

Of the positive ions, electrons, and radicals generated in the plasmas, the positive ions and electrons are re-combined and neutralized while being transported inside a transport tube 24. On the other hand, the radicals are hardly re-combined even in the transport tube 24 because of their relatively long life. When the radicals reach a negative ion generating chamber (a generating space) 19, a majority of them becomes hydrogen atoms, molecules, and radicals.

As has been described above, an apparatus for generating radicals by high-frequency electric discharge is structurally simpler than that for employing electron beams, making it possible to ensure mass-production and drastically improve control properties.

In addition, an electron 17 is supplied to a hydrogen radical 18 introduced into the foregoing negative ion generating chamber by employing an electron supply device 14 connected to a negative ion generating chamber 19. As the electron supply device 14, there may be employed an electron gun of a triode type, heat filament type, or electric field emission type or the like. However, any other device may be employed if it discharges electrons.

With the above mentioned method, the hydrogen radical 18 and the electron 17 are supplied simultaneously into a negative ion generating chamber, and the electrons are adhered to the hydrogen radicals, thereby generating negative hydrogen ions. In addition, elements easily dissociating electrons are added into the negative ion generating chamber, thereby an electron density increases, and the foregoing reaction is further promoted. Elements easily dissociating electrons include, for example, alkali metals such as cesium or rubidium or alkaline-earth metals such as barium, strontium, or calcium.

The negative ions and electrons generated in the negative ion chamber diffuse toward the chamber wall and are re-combined, thereby causing their density to decrease. To prevent this decrease, a magnet 12 for forming a multi-polar magnetic field may be installed on the exterior wall of the chamber of the negative ion generating chamber.

Figure 8:
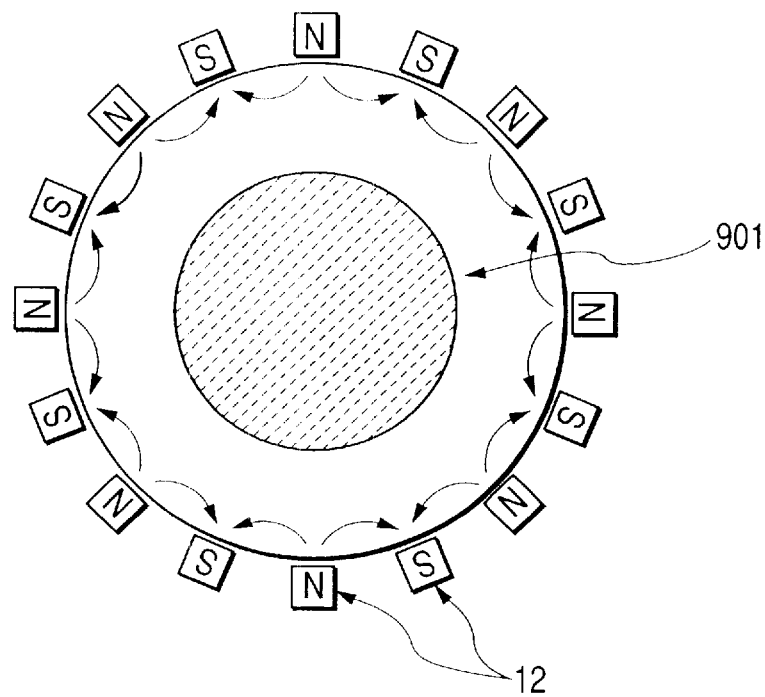
FIG. 8 is a view showing an arrangement of a magnet for containing a negative ion, which is employed in the present invention.

FIG. 8 is a top view of a cross section of the negative ion generating chamber 19 shown in FIG. 7 to clarify an arrangement of magnets required to form a multi-polar type magnetic field, wherein reference numeral 12 denotes a permanent magnet for containing negative ions. By arranging the magnet as shown in FIG. 8, diffusion of electrified particles to the wall is suppressed, and the negative ions with high density can be contained in the negative ion generating chamber.

A grid electrode 8 is installed in a vacuum container to remove negative ions from a gas containing a large amount of the generated negative ions.

Further, a DC voltage of V3 is applied to the grid electrode so that a condition of V3>0 is met. Thus, negative ions are accelerated to about V3 (eV) and are drawn in the grid direction by applying the DC voltage to the grid electrode. The negative ion energy can be arbitrarily adjusted by adjusting the value of V3. In FIG. 7, although there is shown an example when one grid electrode is installed for drawing negative ions, two or more grid electrodes may be employed, as in the aforementioned apparatus.

In this negative ion generating method, a large amount of electrons 17 is emitted from an electron gun 16, and thus, a large amount of electrons other than negative ions is present in the negative ion generating chamber (numeral 901 in FIG. 8) In order to remove electrons from the inside of the gas containing both of negative ions and electrons, a magnetic filter 13 is preferably installed between the negative ion generating chamber and the treatment chamber (treatment space) 5.

Figure 9:
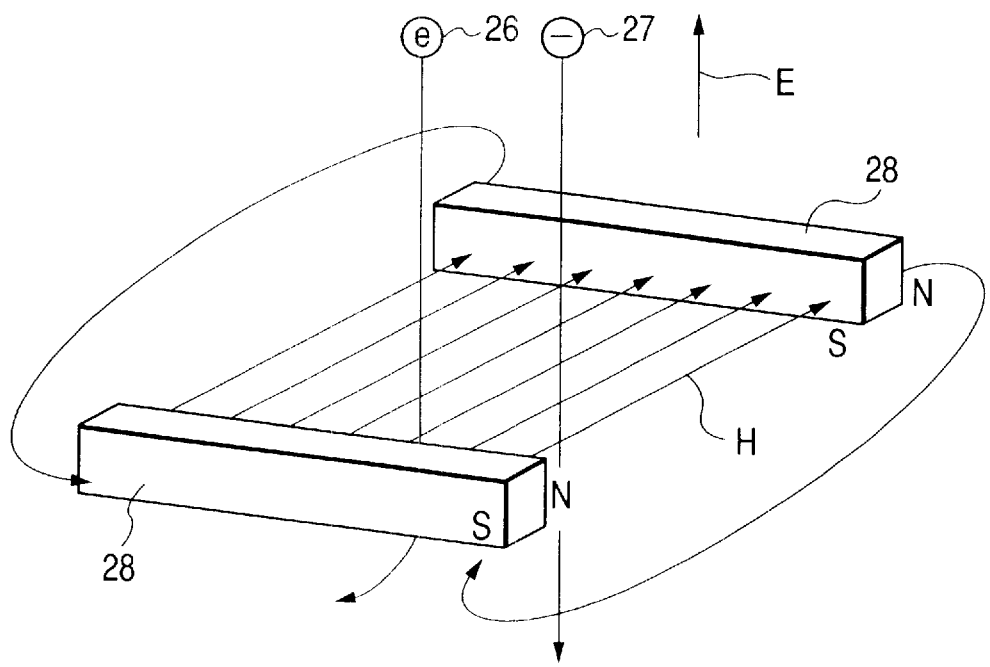
FIG. 9 is a view for illustrating a structure of a magnetic filter and a principle thereof.

FIG. 9 shows a specific structure and principles of the magnetic filter, wherein reference numeral 28 denotes a permanent magnet. In this magnetic filter, two permanent magnets having an arrangement of magnetic electrodes shown in FIG. 9 are arranged in parallel, and a magnetic field is formed in a vertical direction with respect to the electric field in the apparatus. When particles moving in the electric field reach an area in which the foregoing magnetic field is applied, Lorentz force functions. Then, the particles are subjected to a force in a vertical direction with respect to an electric field E and a magnetic field H. An electron 321 and a negative ion 322 having equal electric charges are subjected to a force of the same scale. In this situation, the electron 321 with its small mass is significantly shifted, whereas the orbit of a heavy ion 322 is hardly changed.

Therefore, electrons almost collide with the wall of the vacuum container, and only negative ions impact an object.

A support base 11 of the object to be treated is installed in the downstream direction of the thus drawn negative ions. In addition, a grid electrode for capturing secondary electrons is installed just in front of the support base 11. In FIG. 7, the grid electrode 8 is compatible with a grid for capturing secondary electrons. DC voltages Vs and V3 are applied to the support base 11 and the grid 8, respectively, and the voltage value is set so that a condition of V3>Vs>0 is met. The thus drawn negative ions from the plasmas have energy of about Vs (eV) and are incident to the object to be treated W. In addition, the secondary electrons emitted from the surface of the object to be treated W are accelerated to an electric field of V3–Vs, and are captured by the grid 8, preventing excessive negative charge from accumulating on the surface of the object to be treated W The incident energy of the negative ion to the object to be treated W and the quantity of the secondary electron discharge from the surface of the object to be treated W can be arbitrarily adjusted by adjusting potentials of V3 and Vs. In addition, when the object to be treated W is directly installed on the support base 11 the accumulated negative electric charge on the surface of the object to be treated W inflows the support base 11 through a gate oxide film. As a result, the gate oxide film may be destroyed. To prevent this destruction, an insulation plate may be installed between the support base 11 and the object to be treated W. The insulation plate may be composed of alumina or alumina nitride and the like. However, all materials having insulation properties and high plasma resistance can be applied.

When treatment is carried out by employing the thus structured apparatus, neural radicals are not intentionally eliminated, and thus, neutral radicals other than negative ions impact the object to be treated. However, since motion energy of the incident radicals is very low, the radicals merely adhere to the surface of the object to be treated, and an effect due to spontaneous reaction can hardly be expected. However, if negative ions with energy impact a surface on which hydrogen is adsorbed, so-called ion assist reaction occurs. Thus, the reaction velocity is considered to be increased more significantly than that when only negative ions are incident. That is, the presence of neutral radicals provides an advantage of increased cleaning velocity, and provide no disadvantage, and thus, there is no need to carry out intentional elimination.

When treatment is carried out by employing negative ions, the object to be treated is acted on as follows: First, even if negatived ions are incident to the object to be treated, when the incident energy is about 10 eV or more, secondary electrons are emitted, preventing negative charging. In addition, even if incident energy becomes some tens of eV or more, and two or more secondary electrons are emitted, an effect in which electrons are drawn back to a positively charged object functions, and thus, the voltage is stabilized at several volts. In Japanese Patent Application Laid-Open No. 7-122539, there has been proposed a treatment using low energy ions of 20 eV or less. Even at an energy of 20 eV or more, the above mentioned charging suppression effect is not lost. In addition to the above, there is provided another advantage of negative ions in that the negative ions are lower than positive ions in temperature of the surface of the object to be treated to which negative ions are incident. This is because a reaction in which positive ions return to neutral atoms is a heat generating reaction, whereas a reaction in which negative ions return to neutral atoms is a heat absorption reaction. As a result, even if the negative ions are incident to the object to be treated, the local surface temperature in the vicinity of an ion incidence point is lower than that during positive ion incidence, and thermal damage to the object, for example, crystal distortion or photo resist mask degeneration, is reduced. As has been described above, there is achieved proper cleaning treatment free of charge on the surface of the object to be treated, free of electrostatic destruction of a gate oxide film, and having less thermal damage on the object to be treated.

Figure 10:
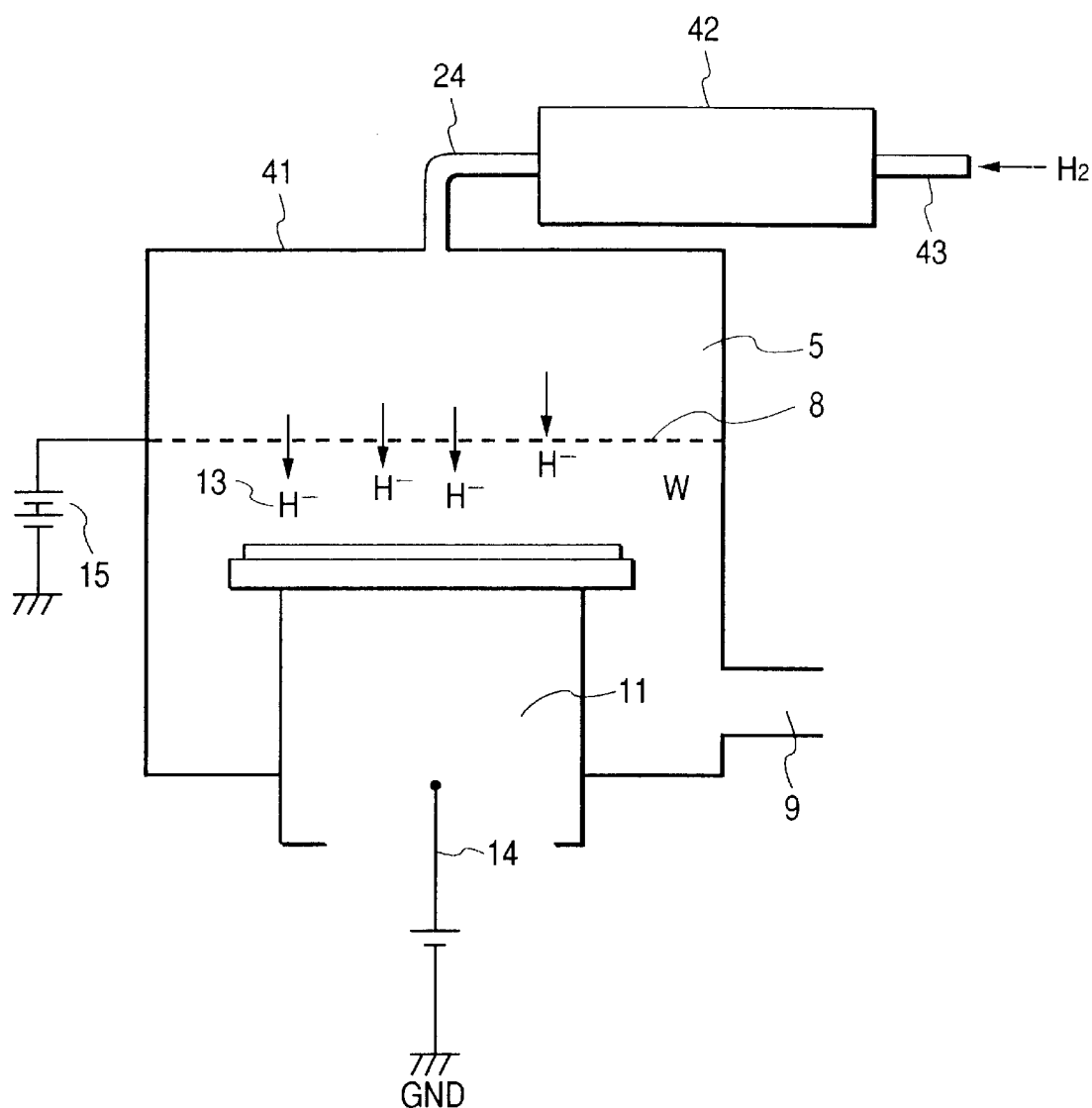
FIG. 10 is a schematic cross-section for illustrating a structure of a treating apparatus with a negative hydrogen ion according to one preferred embodiment of the present invention.

FIG. 10 shows a treating apparatus according to another preferred embodiment of the present invention, wherein a wafer W being an object to be treated is maintained on a stage arranged in a container 41 called a "chamber" or a support base 11 called a "susceptor". A positive potential is applied to the stage 11 by a bias power source 14. In this manner, negative hydrogen ions are accelerated to a desired speed and are imparted to the wafer W, and thus, cleaning can be carried out at a high speed by an ion assisted effect.

A negative ion control grid 8, which functions in the same manner as the bias power source 14, is arranged up the stage 11. In this manner, negative hydrogen ions (H⁻) are accelerated so that the accelerated ions may be passed through a number of opening holes of the grid 8 and guided near the wafer W at a desired speed.

A negative ion generating portion 42 for generating negative ions is arranged on the top of a chamber 41, and a hydrogen gas ($H_2$) is introduced from an introducing port 43 of a negative ion generating portion 42. Further, an air exhaust port 9 for exhausting the reacted gas is provided transversely or down the stage 11, and is connected to an air exhaust pump (not shown).

The introduced hydrogen gas is changed to negative hydrogen ions at the negative ion generating portion 42 and the negative hydrogen ions diffuse in the chamber 41. Then, the diffused ions are accelerated to a desired velocity by the negative ion control grid 8 provided inside the chamber 41 or accelerated to a desired value by a positive potential applied to the stage 11. Then, the ions reach the surface of the wafer W, and the barrier metal surface is cleaned. In recent years, a contact, bottom of a via hall, or a side wall with a large aspect ratio (height/width) is cleaned at a low pressure from several Pa to 0.1 Pa.

Figure 11:
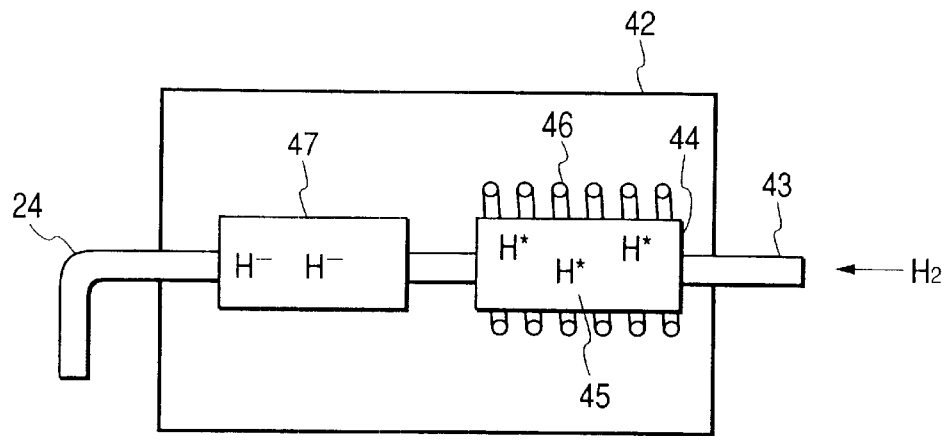
FIG. 11 is a schematic cross-section for illustrating a negative hydrogen ion generating portion.

FIG. 11 is a schematic view showing the simplest example of the negative ion generating portion 42 shown in FIG. 10A hydrogen gas is introduced from a right pipe being an introducing port 43, and is carried to a pipe type radical generating portion 44. An interior face of a pipe 45 of the radical generating portion 44 is made of a metal, including nickel, by a catalytic reaction, and the periphery is covered with a heater 46, and is heated at a temperature from 300° C. to 600° C. Hydrogen is decomposed by a reaction with a metal surface being a catalyst by being passed in this heated atmosphere, and hydrogen radicals (H*) are generated.

The generated hydrogen radicals are further carried to a negative ion conversion portion 47 maintained at a constant temperature. An interior face of a pipe constituting the negative ion conversion portion 47 has a free surface of a metal that generates free electrons with low energy. Hydrogen radicals receive the free electrons from the metal surface and are changed to negative hydrogen ions.

As the material for generating free electrons, there is preferably employed the aforementioned alkaline-earth metals or conductive materials with low work functions, including transition metals such as lanthanides.

In particular, there are preferably employed metals, alloys, or compounds of 3.0 eV or less in work function. Typically, an alkaline-earth metal borate or a chalcogenide or a transition metal borate or a chalcogenide is employed.

Specifically, there are employed BaS (2.05 eV), LaS (1.21 eV), CeS (1.21 eV), GdS (1.46 eV), CaB, (2.86 eV), SrB$_6$ (2.67 eV), ScB$_2$ (2.29 eV), YB$_4$ (2.08 eV), YB$_6$ (1.87 eV ), LaB$_6$ (1.75 eV), LaB$_{12}$ (2.16 eV), CeB$_6$ (2.59 eV), CeB$_{12}$ (2.20 eV), PrB$_6$ (2.30 eV), GdB$_4$ (1.45 eV), GdB$_6$ (1.55 eV) or the like.

In addition, although it is not shown in the figure, the negative ion conversion portion 47 may be beated by a heater in order to increase a quantity of free electrons. The generated negative hydrogen ion is introduced from the upper part of the chamber 41. Further, since the heater is employed, cooling mechanisms such as water cooling may be provided on both sides of the heater to prevent the adjacent portions from being affected due to the heating.

Figure 12:
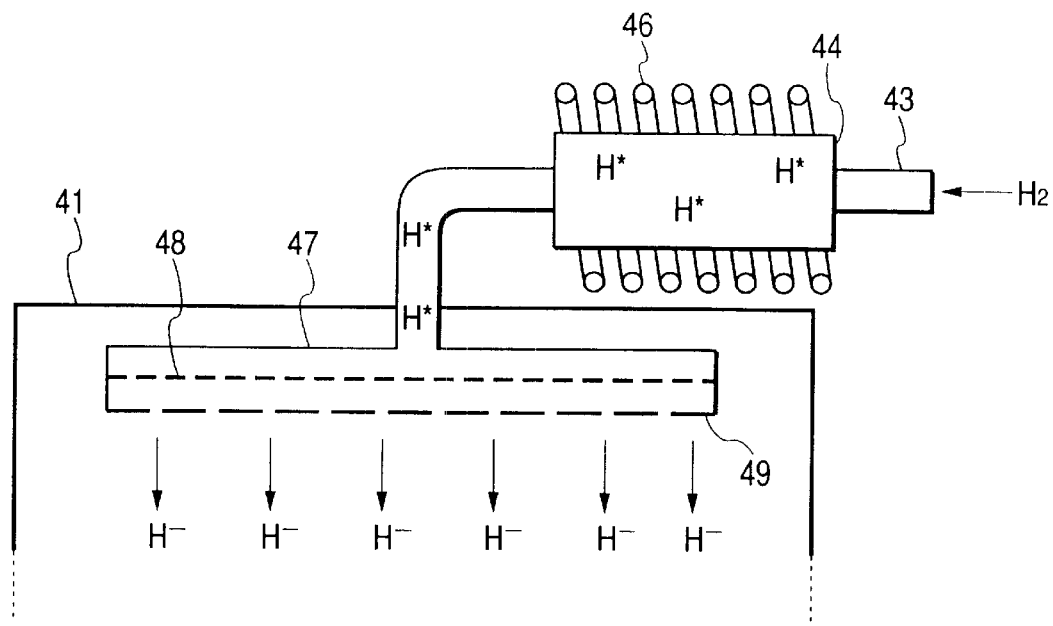
FIG. 12 is a schematic cross-section for illustrating a negative ion generating portion of its shower head structure.

FIG. 12 shows another negative ion generating portion employed for the present invention. In the figure, there is also shown an example of the negative ion conversion portion in which the efficiency of conversion into negative ions is increased at the negative ion generating portion 42 more significantly than that as shown in FIG. 11. The radical generating portion 44 is structured in the same manner as that shown in FIG. 11, and is arranged at the upper part of the inside of the chamber 41, so that the introduced hydrogen gas is converted into hydrogen radicals. The converted hydrogen radicals diffuse to the negative ion conversion portion 47 arranged in the chamber 41.

In this example, a shower head structure frequently employed for an etching device or the like is adopted to the negative ion conversion portion 47 in order to increase an area for contact with free electrons. A plurality of discs whose structure is capable of increasing the surface area may be employed without being limited to this shower head structure Further, even a structure having a number of fine pipes bundled can be provided.

At the shower head type negative ion conversion portion 47 its interior wall or interior portion including an intermediate plate 48 is made of metals such as platinum, and a number of free electrons are present on the surface. The introduced hydrogen radicals are converted into negative ions by being contacted with free electrons. At this shower head, there is arranged an intermediate plate 48 formed by a metal having its surface made of materials for generating free electrons having a number of opening holes in order to increase the conversion efficiency, thereby increasing the conversion efficiency more significantly. In this example, although only one intermediate plate 48 is arranged, a plurality of plates can be arranged. The converted negative ions are diffusively emitted to the inside of the chamber 41 from a diffusion plate 49 having a number of holes drilled at the lower part of the shower head type ion conversion portion 47. An interior face of the shower head type ion conversion portion 47 of the diffusion plate 49 may have a surface of a metal with its low work function in order to increase the conversion efficiency. Further, a negative voltage may be applied to the portion 47 to prevent the converted negative ions from coming into contact with the metal with its low work function Of course, the positive voltage can be applied to the structure shown in FIG. 11. In addition, the foregoing positive voltage acts to slightly reduce the work function on the metal surface, thus making it possible to further improve the efficiency of conversion of hydrogen radicals into the negative ions.

Figure 13:
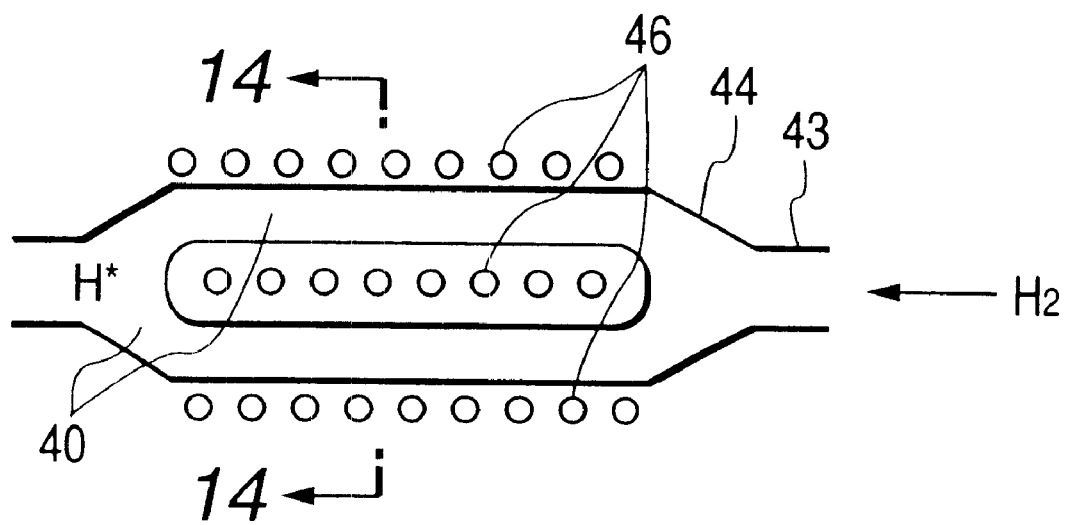
FIG. 13 and FIG. 14 are schematic cross-sections for illustrating a radical generating portion of a structure having a plurality of plates.
Figure 14:
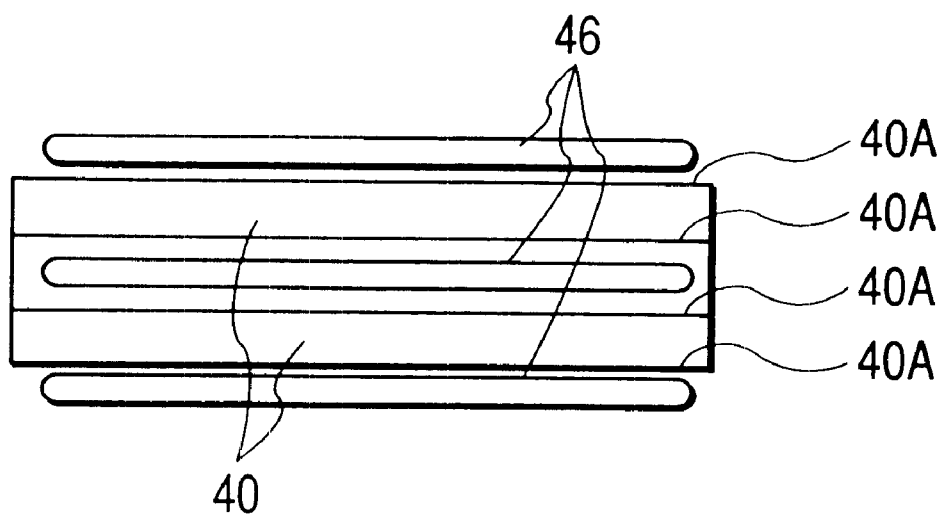

FIG. 13 and FIG. 14 each show an example of a plate type radical generating portion at which radial generation efficiency is enhanced. In this example, a surface area is increased in order to enhance the generation efficiency. As seen in the cross-section of FIG. 13, a two-stage flow path 40 is present. A four-face metal plates 40A having its surface made of nickel or the like is present, and a heater 46 is arranged outside the metal plates 40A.

To ensure clear understanding of a structure of the radical generating portion, a cross-section of 14—14 of FIG. 13 is shown in FIG. 14. The hydrogen gas introduced from the introducing port 43 is diffusively carried to the radical generating portion 44, so that radicals can be efficiently generated from hydrogen gas through a reaction with nickel.

Of course, a metal such as nickel may be employed for a part of both ends of the metal in FIG. 14, and there is no limitation on increasing the surface area. In this example, although a two-stage hydrogen gas flow comes into contact with a plate 40A covered with four metals made of nickel or the like, a heater may be arranged around a structure in which tubes having fine nickel surfaces are bundled, and a part of the periphery of pipes may be composed of a heater material to provide a simple structure.

Treatment Method

Figure 15:
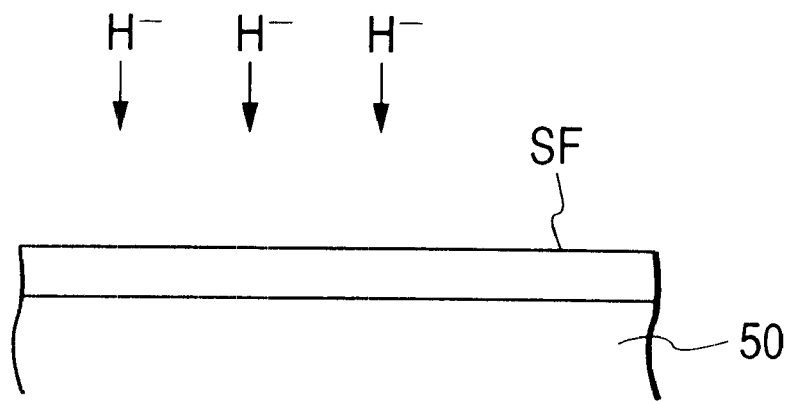
FIG. 15 is a view for illustrating a treatment method according to one preferred embodiment of the present invention.

A treatment method of a surface treated consisting of electric conductors according to one preferred embodiment of the present invention is featured by comprising the step of exposing a surface treated to hydrogen ions in which the quantity of the negative ions is greater than that of the positive ions. FIG. 15 shows a treatment method according to the shown embodiment. An object to be treated 50 is treated by fusing the apparatus shown in FIG. 1 and FIG. 3 to FIG. 14, and a foreign object such as a natural oxide film on the object to be treated 50 having a surface treated SF consisting of electric conductors is reduced by negative hydrogen ions and eliminated.

According to the aforementioned treatment method of the present invention, while damage due to charging is limited, foreign objects such as a natural oxide films adhering to the conductor surface or organic materials such as photo resist residues are eliminated, and the surface can be cleaned.

As an object having a surface to be treated consisting of electric conductors employed for the present invention, there are provided a substrate member composed of electric conductors, which themselves consist essentially of silicon (Si), tungsten (W), aluminum (Al), and copper (Cu) (of course, including pure Si, pure Al, and pure Cu). There may be provided a substrate member in which such conductor film is formed on a whole or partial surface of the base member such as insulation member, conductive member, or semiconductor member. An electric conductor may include at least one kind selected from transition metals such as Ti. V, Cr, Co, Ni, Y, Zr, Nb, Mo, Ru, Pd, Hf; Ta, Jr, or Pt other than the above W, Si, Al, and Cu. A specific example of the electric conductor includes an N-type or P-type doped polycrystal silicon (the doped silicon is a semiconductor from the viewpoint of material properties, but can be regarded as an electric conductor from the functional point of view), i.e., AlCu, AlSi, AlSiCu, AlGe, AlSiGe, AlCaGe, CuGe, AlTi, AlSiTi, TiN, TiSi, TiSiN, AlCr, CoSi, NiSi, MoSi, AlPd, TaN, TaSi. TaSiN, TiW, TaW, WN, or PtSi. These compositions may or may not satisfy a stoichiometric ratio.

More specifically, there are exemplified a Si wafer in which a trench is formed; a Si wafer, a glass substrate, or a quartz substrate in which a gate electrode pattern is formed; a Si wafer, a glass substrate, or a quartz substrate having an insulation film on which a contact hole or a through hole is formed; a Si wafer, a glass substrate, a quartz substrate in which metal wiring or a barrier metal is formed; a Si wafer, a glass substrate, or a quartz substrate in which a groove for damascene processing is formed; or the like. Further, the present invention is applicable to optical parts such as quartz, fluorite, or glass in which a chemical film is formed; and quartz, fluorite, or glass for a diffraction grating having irregularities formed on its surface.

Figure 16:
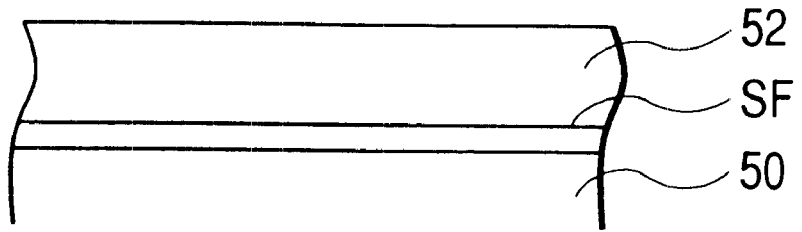
FIG. 16 is a view showing an article having a conductor layer formed on a treated surface.

Further, a surface treatment method according to another preferred embodiment of the present invention is applicable to a process for fabricating a semiconductor device comprising: a surface treatment process for treating a surface consisting of electric conductors; and a depositing process for depositing the electric conductors on the surface-treated face. In this case, an electric conductor may be further deposited on the face treated consisting of electric conductors treated according to the aforementioned preferred embodiment. In this case, a conductor that is the same as or different from the backing conductor may be deposited FIG. 16 shows an apparatus in which a conductor layer 52 is formed on a surface treated SF after a surface SF of a conductor layer 51 is surface-treated by negative hydrogen ions. According to the preferred embodiment a laminated electric conductor with its good electrical contact is obtained with out damage due to charging.

In addition, a process for fabricating a semiconductor device according to one preferred embodiment of the present invention, as described below, is featured by comprising: a cleaning process for cleaning an interior face of a groove formed on an insulation film provided on a substrate; and a process for depositing a wiring electric conductor in the groove, wherein the cleaning process comprises the step of carrying out a treatment by supplying in the groove hydrogen ions in which the quantity of negative hydrogen ions is greater than that of positive hydrogen ions.

In the wire forming step of the semiconductor device manufacturing process, wiring between elements is provided by electric conductors made of aluminum, tungsten or copper and the like as a wiring material. Before these wiring materials are deposited and filmed, a thin metal film called a "barrier metal" such as titanium nitride, tantalum nitride or the like is deposited. Such a structure, including a barrier-metal surface, is often cleaned in advance.

Figure 17:
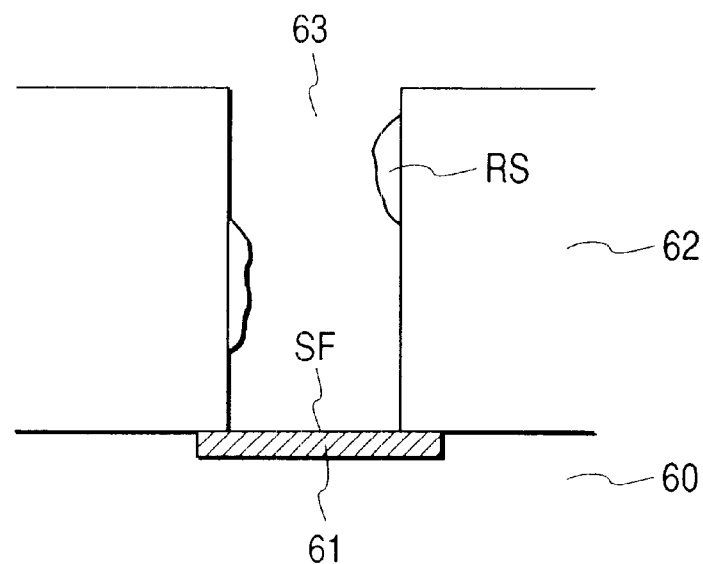
FIG. 17 is a sectional view of an object to be treated.

FIG. 17 is a sectional view showing a structure of a contact hole in a source drain area for an element formed on a wafer, or a structure of a groove 63 called a "via hole" or "through hole" and a barrier metal 61 to ensure continuity between wires. In this example, after forming a first layer of barrier metal 61 an insulation film 62 is deposited on which a photo resist pattern is formed and etching for forming the groove 63 is carried out. Then, a resist is eliminated by ashing. The surface SF of the barrier metal 61 is covered with a thin oxide layer by being exposed to an oxygen atmosphere such as air between the steps of forming the barrier metal 61 and post-etching, and being exposed to oxygen plasmas in the ashing step. Further, a polymer is deposited on the surface SF of the barrier metal 61 on the side wall and bottom of the groove during etching, and the polymer may not be sufficiently eliminated in the subsequent ashing step, and a polymer dreg RS may remain.

When a wiring material is deposited on an oxidized barrier metal surface. continuity between the barrier metal and the wiring material cannot be provided.

Thus, before depositing the wiring material, a surface oxide layer is eliminated by a physical cleaning (eliminating) method using Argon sputtering, a chemical cleaning method using chloride trifluoride, or a reactive plasmas cleaning method using halogen based gas and plasmas.

However, halogen-based gas such as chloride or fluoride has high chemical reactivity and corrodes the inside of a vacuum manufacturing apparatus for depositing metal materials. The gas taken in by wiring materials corrodes the wiring and lowers reliability. Further, if the gas leaks to a clean room during air exhaust treatment or cleaning and maintenance of the vacuum manufacturing apparatus, it may contaminate the inside of the clean room.

In the conventional cleaning method using plasmas such as sputtering or a reactive plasma method, positive ions are employed. When the positive ions collide with a barrier metal, a large amount of secondary electrons is generated. A surface electrification voltage differs depending on sites because of non-uniformity of plasma density Thus, an abnormal current flows between elements, and the elements may be destroyed.

Further, use of only radicals does not cause an ion assisted effect, and the cleaning time is increased.

In the wire forming method as described below, there can be solved problems such as contamination due to halogen-based gas; breakdown of elements due to positive ions, and lowered cleaning speed by employing only radicals.

In addition, a process for fabricating a semiconductor device according to one preferred embodiment of the present invention as described below is featured by comprising a cleaning process for cleaning an interior face of a groove formed on an insulation film provided on a substrate; and a process for depositing a wiring electric conductor in the groove, wherein the cleaning process comprises the step of performing treatment by supplying in the groove hydrogen ions in which negative hydrogen ions are more than positive hydrogen ions in quantity.

Figure 18A:
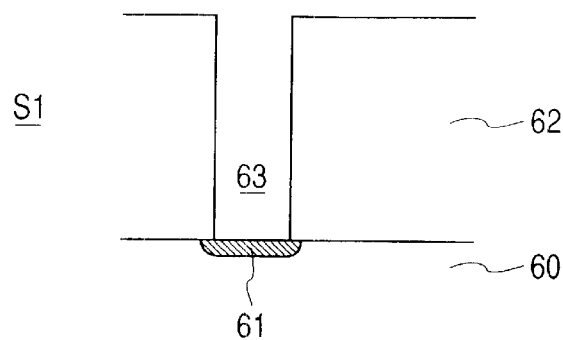
FIGS. 18A, 18B and 18C are views showing a semiconductor device manufacturing process according to one preferred embodiment of the present invention.
Figure 18B:
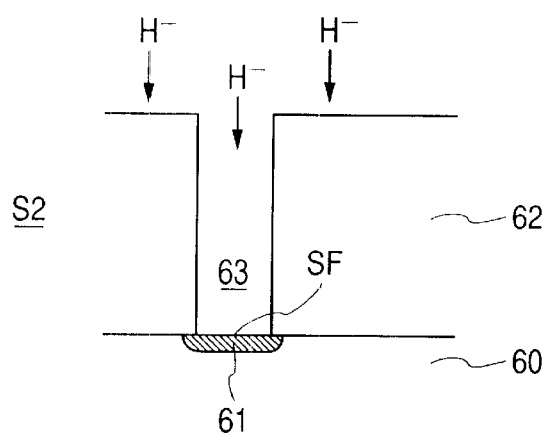
Figure 18C:
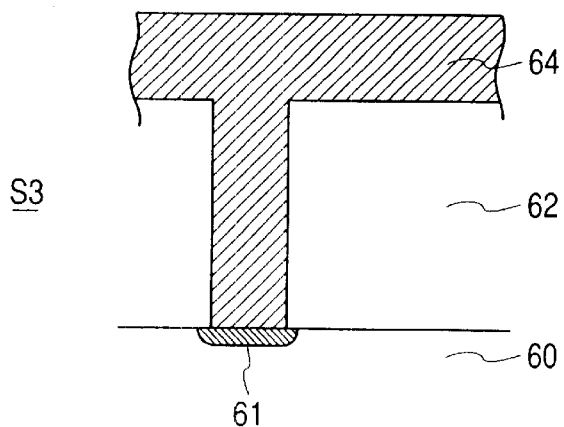

FIGS. 18A, 18B and 18C show a method for forming another electric conductor after a substrate having an insulation film on which a opening hole being a groove is formed is surface-treated by negative hydrogen ions.

First, a barrier metal 61 is formed at apart of a substrate 60 such as silicon wafer on which an insulation film 62 such as silicon oxide is formed. A opening hole 63 called a contact hole, through bole, or via hole is formed by reactive ion etching or the like (step S1, FIG. 18A). In this case, such dregs RS as shown in FIG. 17 may remain.

Next, using the apparatus shown in FIG. 1 and FIG. 3 to FIG. 14, the surface treated SF of the barrier metal 61 exposed from the opening hole 63 is cleaned by negative hydrogen ions. At this time, a side face of the opening hole 63 and a top face of the insulation film 62 are cleaned (step S2, FIG. 18B). In this manner, even if the residue remain, it will be eliminated.

Then, a wiring electric conductor 64 is deposited in the opening hole 63 and on the top face of the insulation film 62 using a CVD method or the like (step S3, FIG. 18C).

According to the shown embodiment, damage due to charging is suppressed, and a barrier metal surface is cleaned. Thus, electrical contact between the conductor 64 and the barrier metal is improved, making it possible to suppress higher wiring resistance.

In the shown embodiment, the barrier metal 61 may be formed after the insulation film 62 and the opening hole 63 have been formed. In this case, after forming the opening hole, an exposed bottom face may be a nitride or a silicide.

In addition, the wiring electric conductor 64 can be formed in the two steps of: selectively depositing an electric conductor such as W, Al, Cu, or Au in a opening hole by the CVD method or the like; and depositing an electric conductor again on the deposited conductor in the opening hole and on the insulation film 62 by the CVD method or the sputtering method. Alternatively, after an electric conductor is deposited in at least the opening hole 63, an unnecessary conductor is polished and eliminated up to the top face level of the insulation film 62 by chemical and mechanical polishing (CMP), so that an electric conductor may be formed by the CVD method or sputtering method again.

Figure 19A:
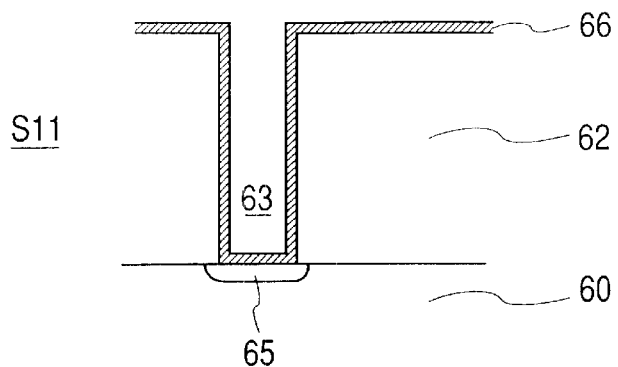
FIGS. 19A, 19B and 19C are views showing a semiconductor device manufacturing process according to another preferred embodiment of the present invention.
Figure 19B:
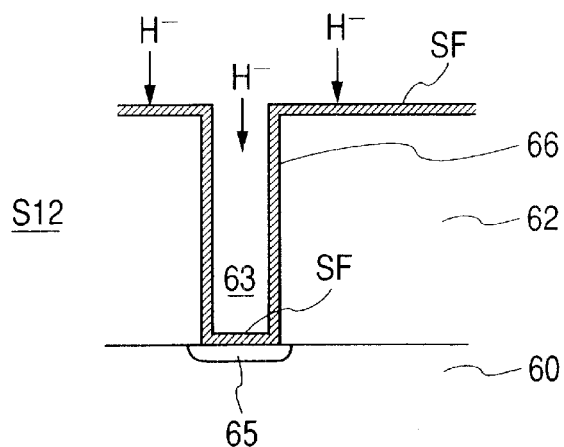
Figure 19C:
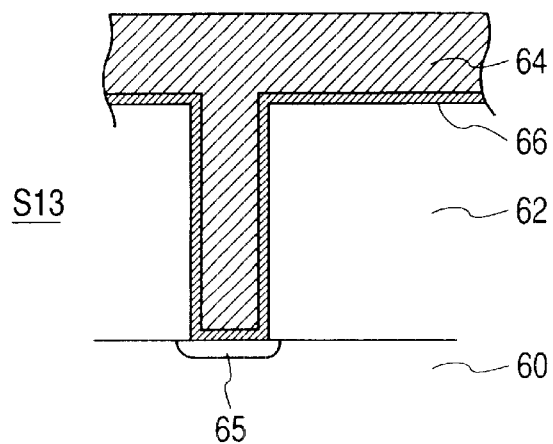

FIGS. 19A, 19B and 19C show a process for fabricating a semiconductor device according to another preferred embodiment of the present invention, i.e., another method for forming another electric conductor after a substrate having an insulation film on which an opening hole being a groove is formed is surface-treated by negative hydrogen ions.

First, a layer 65 consisting of a diffusion layer and/or a first barrier metal is formed on a substrate 60 such as silicon wafer, on which an insulation film 62 such as silicon oxide is formed. An opening hole 63 called a "contact hole", "through hole", and "via hole" is formed by reactive ion etching or the like. A second barrier metal 66 is formed on the interior face of the opening hole and on the top face of the insulation film 62 by the CVD method or the sputtering method and the like (step S11, FIG. 19A).

Figure 20:
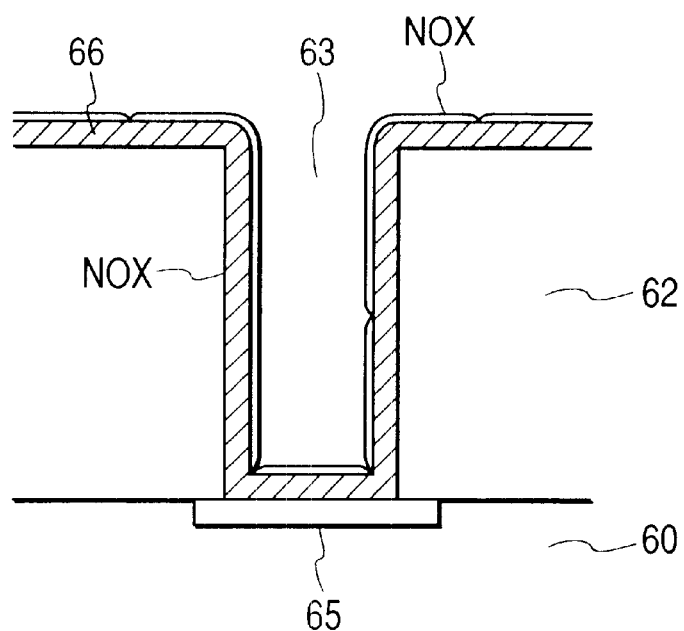
FIG. 20 is a sectional view of an object to be treated.

Thereafter, when the substrate 60 is exposed to an oxygen-containing atmosphere such as air, a natural oxide film NOX may be formed as shown in FIG. 20.

Then, using the apparatus shown in FIG. 1 and FIG. 3 to FIG. 14, the surface treated SF of the barrier metal 66 in the opening hole 63 and on the insulation film 62 is cleaned by negative hydrogen ions (step S12, FIG. 19B).

The wiring electric conductor 64 is deposited on the barrier metal 66 by the CVD method or sputtering and the like (step S13, FIG. 19C).

According to the shown embodiment, the barrier metal surface is cleaned, and thus, electrical contact between the conductor 64 and the barrier metal 66 is improved, making it possible to suppress higher wiring resistance.

In the shown embodiment, the layer 65 may be formed after the insulation film 62 and the opening hole 63 have been formed. In this case, after forming the opening hole, a P-type or an N-type dopant may be diffused on the exposed bottom face, and the bottom face may be a nitride or a silicide.

In addition, the wiring electric conductor 64 can be formed by thinly depositing an electric conductor (CVD conductor) such as W, Al, Cu, or Au onto a barrier metal 66 by the CVD method, and then, depositing an electric conductor onto the CVD conductor again by the sputtering method to cause re-flow as required. Alternatively, after an electric conductor is deposited onto the barrier metal 66, so that at least the inside of the opening hole 63 is embedded, an unnecessary electric conductor on the insulation film 62 is polished and eliminated by the chemical and mechanical polishing (CMP). The electric conductor is left only in the opening hole, and then, the electric conductor may again be formed by the CVD method or the sputtering method.

FIGS. 21A, 21B, 21C and 21D show a process for fabricating a semiconductor device according to a further preferred embodiment of the present invention, i.e., a method for forming another electric conductor after a substrate having an insulation film on which a wiring recess portion and opening hole are formed as a groove is surface-treated by negative hydrogen ions.

First, an insulation film 62 such as silicon oxide is formed on a substrate 60 such as silicon wafer. A groove made of opening hole 63 called a "contact hole", "through hole", or "via hole" and a wiring recess portion 67 is formed by reactive ion etching or the like. Then, the barrier metal 66 is formed on the interior face of the opening hole, on the interior face of the recess portion, and on the top face of the insulation film 62 by the CVD method or the sputtering method or the like (step S21, FIG. 21A).

Figure 21A:
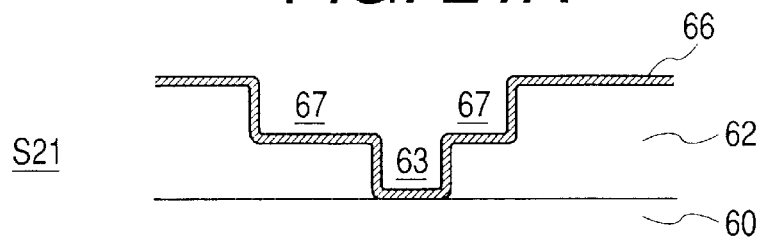
Figure 21B:
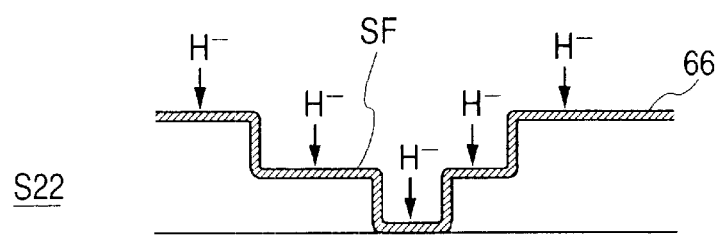

Next, using the apparatus shown in FIG. 1 and FIG. 3 to FIG. 14, the surface treated SF of the barrier metal 66 is cleaned by negative hydrogen ions (step S22, FIG. 21B).

Figure 21C:
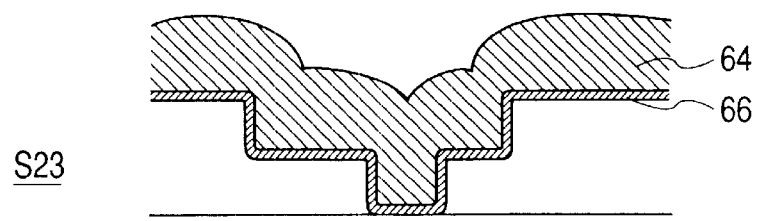
Figure 21D:
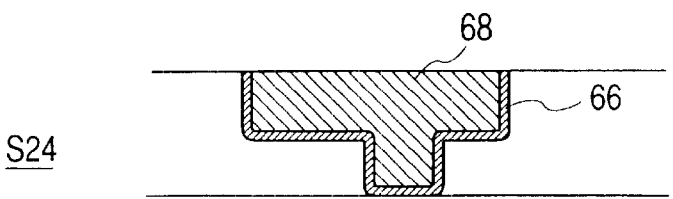

Then, the wiring electric conductor 64 is deposited on the barrier metal 66 by the CVD method or sputtering and the like (step S23, FIG. 21C).

Further, an unnecessary electric conductor 64 is polished and eliminated by the CMP, and a wire 68 is formed in the groove. Such a wire forming method using polishing is known as a dual damascene process (step S24, FIG. 21D).

According to the shown embodiment, while damage due to electrification is suppressed, the barrier metal surface is cleaned. Thus, electric contact between the electric conductor 64 and the barrier metal 66 is improved, Making it possible to suppress higher wiring resistance.

In addition, the wiring electric conductor 64 can be formed by thinly depositing an electric conductor (CVD conductor) such as W, Al, Cu, or Au by the CVD method, and then, depositing an electric conductor on the CVD conductor again by the sputtering method to cause re-flow as required.

Next, a process for fabricating a semiconductor device according to another preferred embodiment of the present invention will be described.

First, a substrate such as a silicon wafer is provided, and a gate insulation film is formed on the surface of a silicon layer. Next, a polycrystal silicon is deposited, a high-melting metal such as Ti, Ta, Pt, Co, W, or Mo is deposited as required, and a conductive layer being a gate electrode or another electrode is formed. This layer is patterned to a desired electrode pattern by RIE or the like. Negative hydrogen ion treatment is carried out using the apparatus shown in FIG. 1 and FIG. 2 to FIG. 14.

Figure 22:
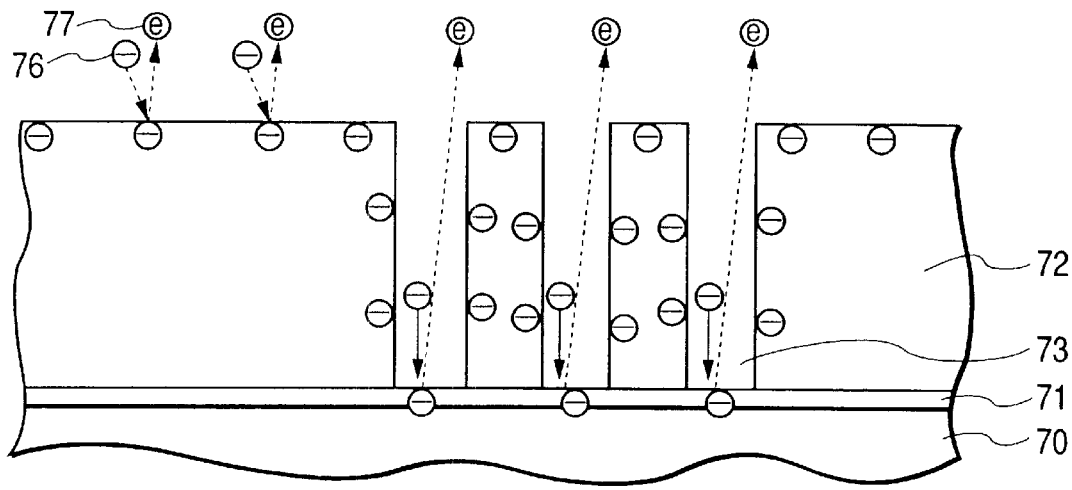
FIGS. 22 is a view for illustrating a process for fabricating a semiconductor device according to a still further preferred embodiment of the present invention.
Figure 23:
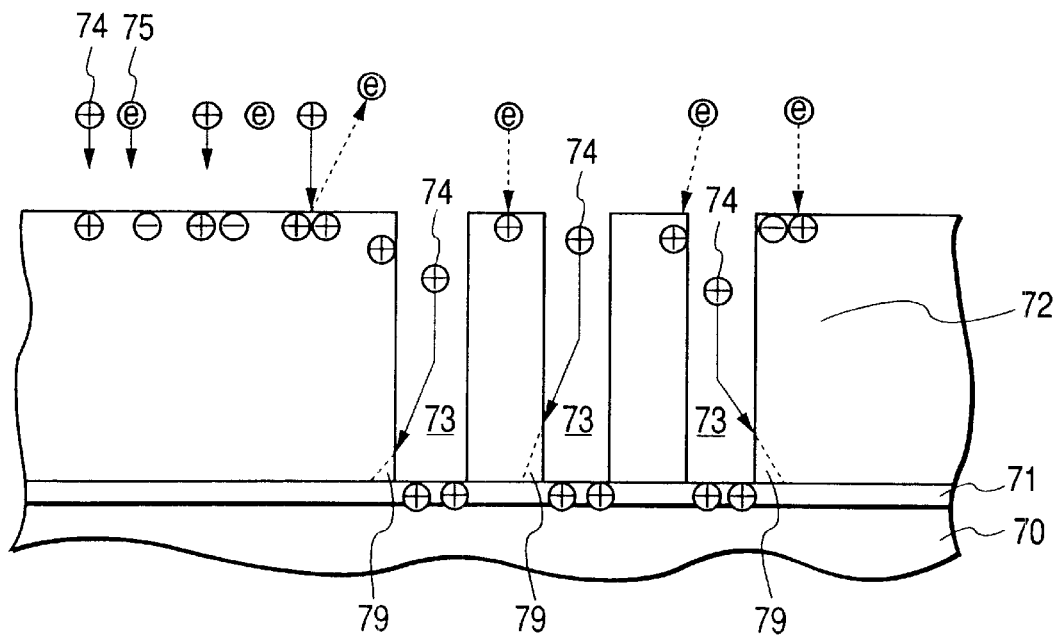
FIG. 23 is a view for illustrating treatment using positive ions.

FIG. 22 and FIG. 23 are schematic views for illustrating cleaning of the inside of a groove. In FIG. 22 and FIG. 23, reference numeral 70 denotes a substrate member; reference numeral 71 denotes an insulation film; reference numeral 72 denotes an electric conductor; reference numeral 73 denotes a groove, reference numeral 74 denotes a positive ion; reference numeral 76 denotes a negative hydrogen ion; reference numeral 75 denotes an electron; reference numeral 79 denotes an abnormal shape; and reference numeral 77 denotes a secondary electron.

FIG. 23 shows an example of cleaning using positive ions. A positive ion 74 and an electron 75 are alternately incident to a substrate member 70 during one period of an AC electric field, thereby to constantly maintain the electrification quantity of the surface of the substrate member 70. However, the insulator surface is slightly electrified with a positive electric charge by secondary electron emission due to incidence of the positive ions. The electron 75 is lighter than the positive ion 74 in mass, and its orbit can be easily shifted. Thus, the electron is shifted in an electric field due to the aforementioned positive electric charge, and the electrodes are hardly incident to the groove. As shown in FIG. 23, more positive ions 74 than electrodes 75 reach a bottom of a deep hole with its large sectional aspect ratio, and a positive electric charge is electrified with the bottom of the hole.

As a result a large positive electric charge is accumulated on the bottom of a contact hole. Positive ions are shifted in the electric field, thereby making it difficult for even positive ions to reach the bottom of the hole, and a cleaning failure occurs. Occasionally, the side wall is sputtered, and an abnormal shape 79 may be generated.

On the other hand, in FIG. 22, since negative ions are mainly employed, a negative hydrogen ion 76 is greater than an electron in mass. Thus, the ion is equally incident to the surface of the substrate 70 independent of the aspect ratio, and the surface of the substrate member 70 is slightly negatively charged. A secondary electron 77 generated by negative ion incidence is emitted without adhering to the surface of a semiconductor substrate 421 again. Therefore, the incident negative ions and positive electric charge due to emission of secondary electrons are offset, and the surface of the substrate member 70 is free from being a significant positive or negative charge. In this manner, in a situation in which the surface of the substrate member 70 is slightly and uniformly changed by carrying out treatment using negative ions, an ion orbit is free form being shifted even if a local electric field is generated, and an abnormal shape is considered to be hardly generated.

In the shown embodiment described above, although a opening hole such as a contact hole or a through hole as a groove and a recess portion for damascene processing are exemplified, the present invention is also applicable to a trench for forming a DRAM capacitor or cleaning of the inside of the trench for separating electrodes. However, in this case, a face to be cleaned may be a semiconductor or an insulator.

In addition, as shown in FIG. 22, the present invention is applicable to a substrate on which a gate electrode pattern or a wiring pattern is formed. In this case, gaps between a plurality of gate electrode or wiring patterns are provided as grooves. Further, these gate electrode patterns can be cleaned by negative hydrogen ions or a polycrystal silicon constituting the gate electrode patterns can be hydrogen-terminated.

As a barrier metal employed for the present invention, an electric conductor called a "high melting point metal" or a "refractory metal" is preferably employed. Many of such electric conductors are made of the aforementioned transition metal, a silicide of the transition metal, and a nitride of the transition metal. Specifically, these metals include Ti, Cr, Co, Ni, Mo, W, Ta, Pt, TiSi, CoSi, NiSi, MoSi, WSi. TaSi, PtSi, TiN, TiSiN, TaN, TaSiN, TiW, TaW, and WN. These compositions may or may not satisfy a stoichiometric ratio.

As a wiring electric conductor employed for the present invention there are preferably employed metals consisting essentially of Al, Cu, and Au such as Al, Cu, AlCu, AlSi, AlSiCu, AlGe, AlSiGe, AlCuGe, CuGe, AlTi, AlSiTi, AlPd.

In the present invention, after the negative hydrogen ion cleaning process, it is preferable to deposit the aforementioned wiring electric conductor without being exposed to air. This can be carried out by an inline type or sheet-fed multi-chamber device, which is described below.

Figure 24:
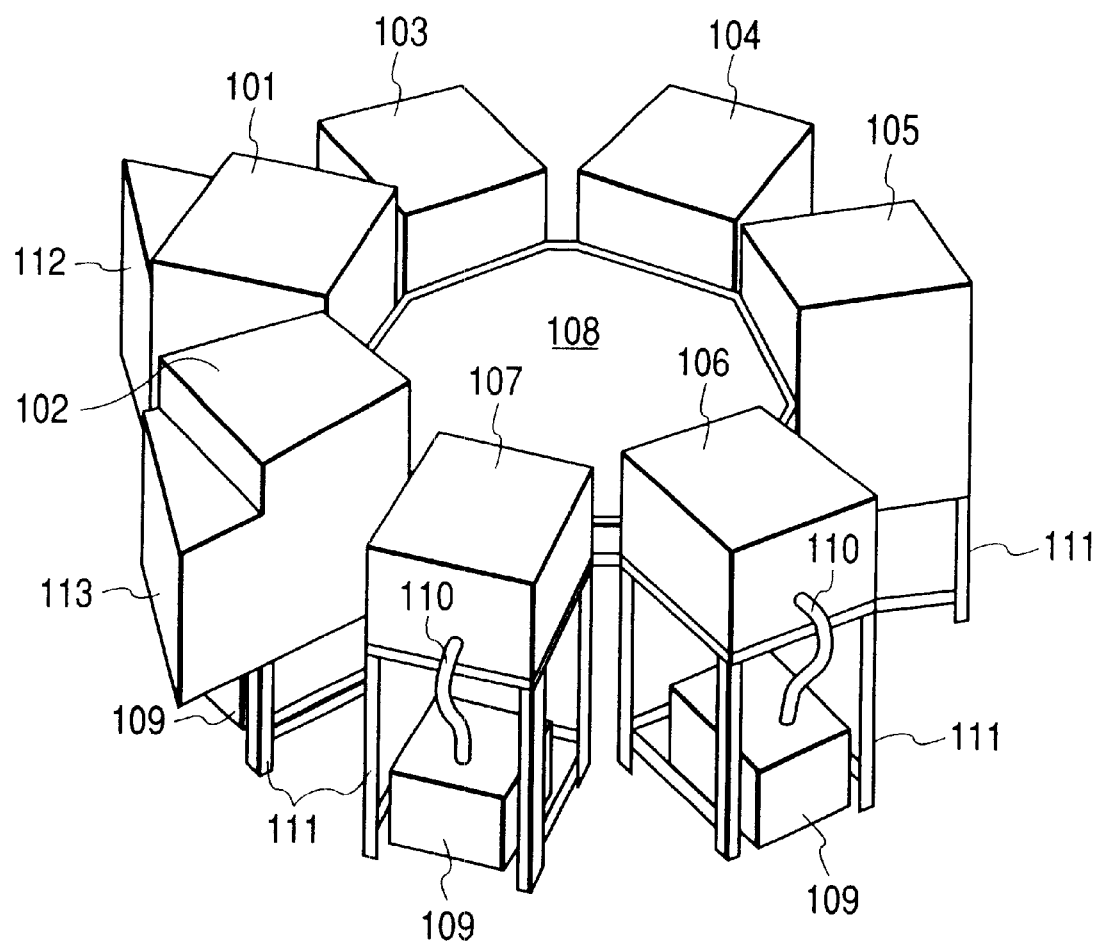
FIG. 24 is a perspective view of a leaf type multi-chamber device employed for the process for fabricating a semiconductor device according to the present invention.

FIG. 24 is a schematic perspective view showing a sheet-fed multi-chamber device having a treating apparatus and a CVD device being a conductor employed for the present invention. A part of the structure shown in FIGS. 18A to 18C through FIGS. 21A to 21D can be fabricated using this device.

In FIG. 24, reference numerals 101 and 102 each denote a load lock chamber for housing a substrate to be treated, reference numerals 103, 104, 106, and 107 each denote a reaction chamber, reference numeral 105 denotes a heating chamber and reference numeral 108 denotes a carrier chamber having a substrate carrier means (not shown) therein. Each chamber is placed on a support base 111.

The above-mentioned chambers each communicate with an air exhaust pump 109 via an air exhaust tube 110, respectively, so that the inside of the chamber can be maintained at a proper pressure. This apparatus of cluster type has reaction chambers 103, 104, 106, and 107.

However, at least one of these chambers is disabled according to the manufacturing process. At this time, an inactive reaction chamber can be separated. Such apparatus is sometimes called a "platform type apparatus."

In a process for fabricating a semiconductor device of the present invention described below, the reaction chamber 107 is inactive.

According to this apparatus, each process can be carried out continuously without exposing the substrate to air, and thus, the apparatus has superior manufacturing reproducibility of a structure.

An operation method is described as follows:

First, a load lock chamber 101 is defined as a substrate carrying-in chamber. Opening and closing means 112 is opened, and a substrate having a barrier metal on its surface is housed in the carrying-in chamber 101. After the air inside of the chamber has been exhausted, a gate valve (not shown) between the carrying-in chamber 101 and the carrier chamber 108 is opened, and the substrate is conveyed into the carrier chamber 108.

The substrate is conveyed into a heating chamber 105, housed therein as required and heated.

The substrate heated in advance is conveyed into a reaction chamber 103 via the carrier chamber 108, and the reaction chamber 103 is sealed. This reaction chamber can be constructed as shown in FIG. 1, FIG. 3 to FIG. 14. The internal pressure of the reaction chamber is maintained to 13.3 Pa to 133 Pa, the substrate temperature is set to 100° C. to 200° C, and the substrate surface, i.e., the barrier metal surface is cleaned. A $H_2$-containing gas is employed, and cleaning is carried out by etching the barrier metal surface by about 5 nm to 10 nm using negative hydrogen ions.

A gate valve of the reaction chamber 103 is opened, the cleaned substrate via the carrier chamber 108 is conveyed from the reaction chamber 103 into the reaction chamber 104, and the gate valve of the reaction chamber 104 is closed. Nitrogen plasma treatment is carried out in the reaction chamber 104. The inside of the reaction chamber 104 is depressurized to about 13.3 Pa to 133 Pa. and the substrate is heated at 200° C. to 450° C. and maintained. In this reaction chamber, grow electric discharge plasmas of nitrogen gas is generated using a parallel, flat plate shaped electrode. Thus, the barrier metal on the substrate surface is a nitride, and the barrier properties are improved. The gate valve of the chamber 104 is opened, the substrate is conveyed from the reaction chamber 104 to the reaction chamber 106 via the carrier chamber 108 and the substrate is maintained at 160° C. to 450° C. in the chamber 106. Then, DMAH gas and hydrogen gas are introduced, and aluminum is deposited on the barrier metal nitride by the CVD method.

After aluminum has been deposited, a gate valve of the reaction chamber 106 is opened, and the substrate is conveyed into the carrier chamber 108. Then, a gate valve of the load lock chamber 102 being a carrying-out chamber is opened, and the substrate is recollected in the load lock chamber 102.

When the treatment conditions in each reaction chamber are adjusted so that treatment is carried out simultaneously in each of the reaction chambers 103, 104, and 106, the number of substrates treated per a predetermined time is increased.

Referring to FIGS. 25A to 25D and FIGS. 26A to 26D, a manufacturing process will be described by way of an example when a structure of FIGS. 18A to 18C is adopted for a source or drawn of a MOS transistor.

A field insulation film in 151 is formed on the surface of Si wafer W using a selective oxidation method, and a gate insulation film 52 is formed Then, a gate electrode 153 made of polysilicon is formed. Further, As-ion is implanted (step S31, FIG. 25A).

Next, an n⁻ type semiconductor layer 155 being a source drain is formed through heat treatment, and the surface is thermally oxidized. A full face of the substrate is anisotropy-etched, and a side wall 154 consisting of silicon oxide is left on the side face of the gate electrode 153 Then, As-ion is implanted again (step S32, FIG. 25B).

After an n+ type semiconductor layer 158 being a source drain has been formed through heat treatment, an oxide film on the source drain and on the gate electrode is etched and eliminated, and a Ti-film is fully deposited by using the sputtering method or the CVD method. Then, the deposited Ti-film is heat-treated, Ti on the source drain and on the gate electrode and Si on its downstream are reacted and bonded to be a silicide. Further, the Ti-film is eliminated by etching. Thus, titanium suicides 156 and 157 are left only on the gate electrode and source drain (step S33).

An insulation film 159 is produced by the CVD method on which a photo resist pattern is formed. With the photo resist pattern being an etching mask, a contact hole 160 is formed by reactive ion etching. Then, the photo resist pattern is eliminated by ashing or the like. It is desirable that the insulation film 159 is polished and smoothened by the CMP before etching.

Next, the steps S35 (FIG. 26A) and S36 (FIG. 26B) are performed using the sheet-fed multi-chamber device shown in FIG. 24.

Figure 25A:
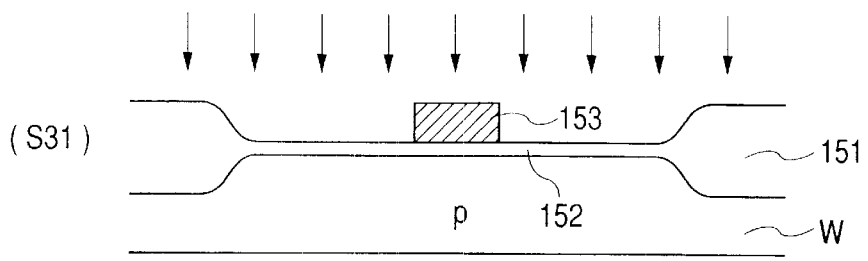
FIGS. 25A, 25B, 25C and 25D are views showing the first-half steps of the process for fabricating a semiconductor device according to a yet further preferred embodiment of the present invention.
Figure 25B:
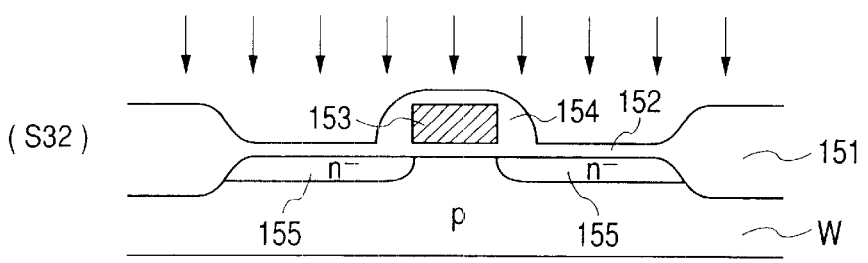
Figure 25C:
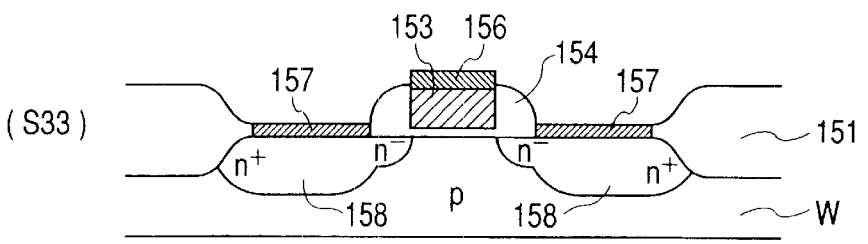
Figure 25D:
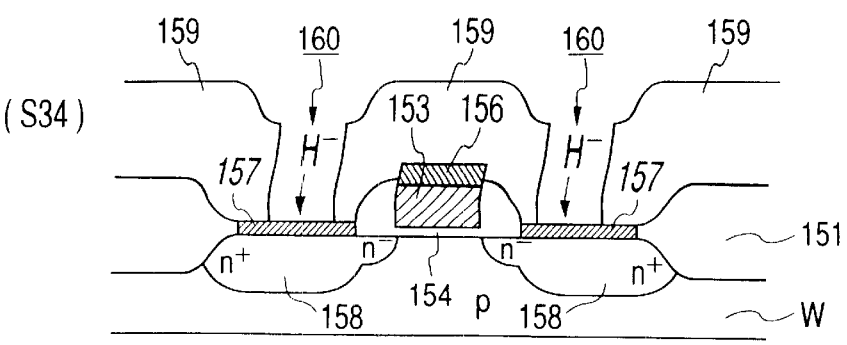

The surface of a titanium silicide 157 is cleaned by negative hydrogen ions (step S34. FIG. 25D).

Then, a wafer W is maintained at 400° C., the pressure is set to 27 Pa, and a surface of the substrate is exposed to $N_2$ plasmas. Thus, a titanium silicide layer exposed from the contact hole is a nitride, and a non-single crystal TiSiN film 161 of 9 nm in thickness is generated (step S35, FIG. 26A).

At this time, nitrogen atoms are doped on the surface of an insulation film 159 such as silicon oxide or on the side face of the contact hole. The nitride process mentioned above may be carried out without plasmas.

Next, an Al plug 162 is formed in a contact hole by a selective CVD method using D and $H^2$. (step S36, FIG. 26B).

Then, a substrate is removed from the apparatus shown in FIGS 24. Next, unnecessary deposited Al is eliminated by etching or CMP as required, and a conductive film 163 such as AlCu is further produced with the sputtering method or the CVD method using another apparatus (step S37, FIG. 26C).

Figure 26A:
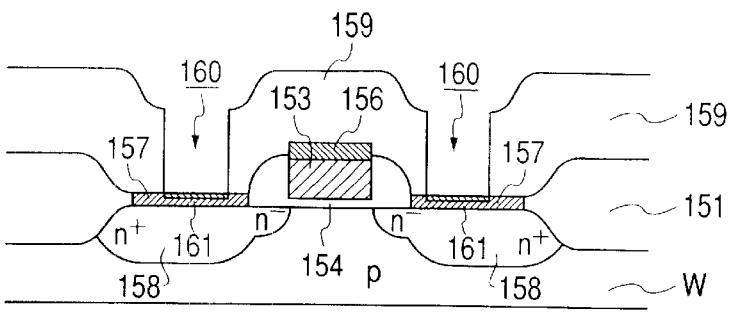
FIGS. 26A, 26B, 26C and 26D are views showing the latter-half steps of the process for fabricating a semiconductor device according to a yet further preferred embodiment of the present invention.
Figure 26B:
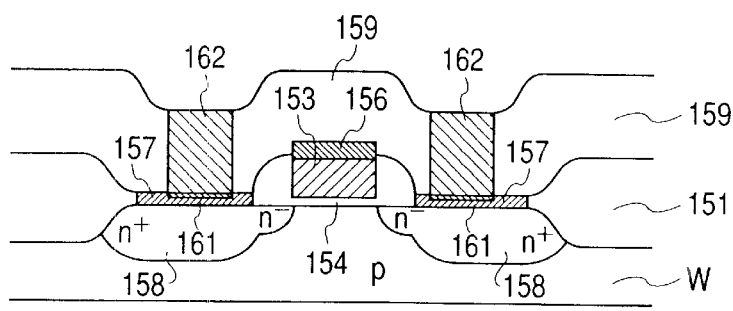
Figure 26C:
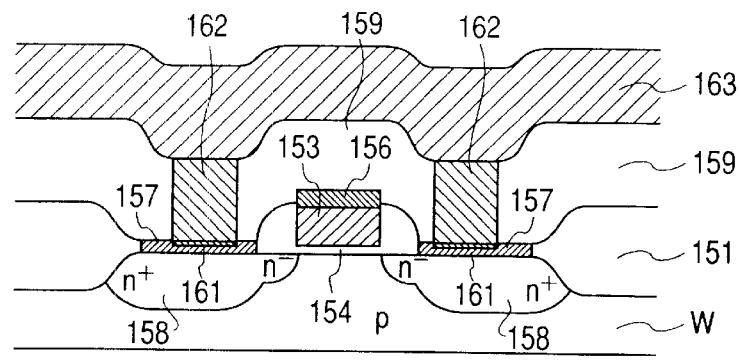
Figure 26D:
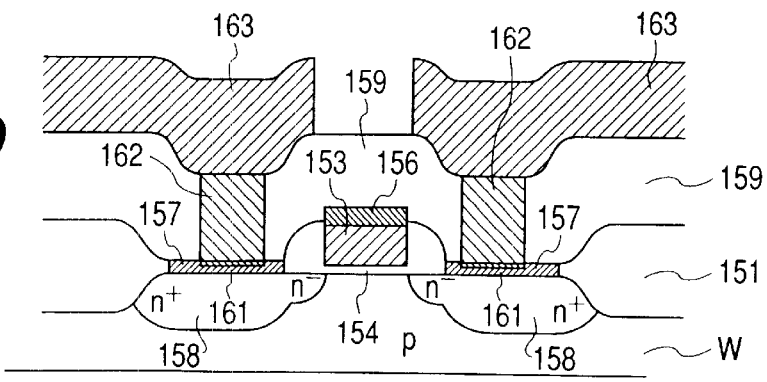

Lastly, the conductive film 163 is patterned in a source drain wiring shape by etching the film (step S38, FIG. 26D).

As has been described above, according to the shown embodiment, an amorphous silicon titanium nitride (a-TiSiN) layer is provided as a barrier layer, and thus, a quality conductor film can be formed on the barrier layer. In particular, even if the barrier layer according to the present invention is reduced to less than 10 nm in thickness, a quality continuous thin film is produced, and moreover, a resistance value in the thickness direction is sufficiently lowered. In addition, no barrier layer is present on the side wall of the contact hole, a low-resistance plug grown on the barrier layer is provided in contact with the side wall, and thus, the contact resistance is lowered. In this manner, a structure of a fine, low-resistance contact hole portion can be obtained.

A semiconductor device manufacturing process according to one preferred embodiment of the present invention will be described. Hereinafter, in a via hole forming process for connecting between different wire layers of multi-layered wiring, there is shown an example of a cleaning process before the upper layer metal wire is filmed.

A sectional-plane structure of an object to be treated in the shown embodiment will be described with reference to FIG. 27.

In FIG. 27, W denotes a silicon substrate, reference numeral 432 denotes an element separation oxide film, reference numeral 433 denotes a gate oxide film, reference numeral 434 denotes a gate electrode, reference numeral 435 denotes a first inter-layer oxide film, reference numeral 436 denotes a first layer metal wire, reference numeral 437 denotes a barrier metal of a first layer metal wire, reference numeral 438 denotes a reflection proof film of a first layer metal wire, 439 denotes a second inter-layer oxide film, reference numeral 440 denotes a via hole formed as a groove by dry etching, NOX denotes an oxide layer with its thin reflection proof film surface, RS denotes a residue of a polymer adhered in dry etching for forming a via hole.

In the via hole 440 on a silicon substrate surface, a crystal defect introduced by a natural oxide film or ion shock during etching or a residue RS of the polymer adhered in dry etching and the like remains. Thus, when a second layer metal wire 440 is formed, a resistance value of the via hole is increased by a natural oxide film, a crystal defect, or impurities, bringing about a circuit delay or a continuity fault of wiring. These residues are removed by cleaning. However, when these residues are taken in air after cleaning treatment, a natural oxide film is formed again on a cleaned surface, and thus, it is desirable to maintain a vacuum between cleaning and the second layer metal wire. A method for manufacturing a semiconductor device that meets this requirement using plasmas is widely used. However, the problem is a charge-up phenomenon associated with plasmas When this cleaning is carried out by a positive ion treatment, a positive charge introduced by plasmas flows a gate electrode 434 through a first layer metal wire 436. Finally, a voltage is applied to a gate oxide film 433 existing between a silicon substrate W and the gate electrode 434. When this voltage reaches a breakdown voltage, the gate oxide film 433 results in electrostatic breakdown. In addition, a fine tunnel current flows the gate oxide film 433 at a destruction voltage or less, thereby significantly degrading the service life.

A semiconductor substrate having the above structure is installed on a substrate base 11 of the apparatus shown in FIG. 7. Then, a negative ion generating chamber 19 and a semiconductor substrate treatment chamber (treatment space) 5 are air-evacuated via an air evacuating system, and is pressure-reduced until the pressure is about 6.7×104 Pa. Then, a hydrogen gas of 150 sccm is supplied from a process gas introducing port 4, a slot valve (not shown) installed on the air evacuating system is adjusted, and a pressure of the semiconductor substrate treatment chamber 5 is set to about 1.33 pa. Here, the power of 250 W is supplied from a microwave power source 21 to a wave guide, and a microwave electric discharge plasma 3 is generated. The generated plasmas are bonded with each other again in a transport tube, and is transported downstream by about 50 cm, a majority of which becomes hydrogen radicals, and is supplied to the negative ion generating chamber 19.

Next, a current of 50 A flows a filament of a heat filament type electron supply device 16, and further, a voltage of 5 V is supplied to a lead-out electrode (not shown) in an electron supply device. In this manner, a heat electron emitted by the filament is supplied into the negative ion generating chamber 19 having the energy of about 5 eV. In the negative ion generating chamber 19, the hydrogen radicals and electrons adhere to each other, and a negative hydrogen ion is generated.

To remove this negative hydrogen ion, a DC voltage of 55 V is applied to a grid 8. Further, a DC voltage of 50 V is applied to a semiconductor substrate support base 11. When the above voltage is applied to each grid, a negative ion is incident to the semiconductor substrate W with energy of about 50 eV. In addition, an excessive secondary element emitted from the substrate is drawn by an electric field of 5 V, and is tracked by the grid 8.

After treatment is carried out for about 30 seconds by negative hydrogen ions shown above, a substrate maintained in vacuum is moved to a metal wire filming chamber, and a second layer metal wire is deposited. A surface morphology of the deposited film is optimized, and its reflection index indicates a value of 200% to a silicon substrate. Subsequently, a second layer metal wire 441 is formed through photo resist patterning and dry etching or the like.

Thus, when treatment is carried out mainly for negative ions, a potential of the first layer metal wire is limited to several volts or less, which is an operating voltage of the semiconductor element. Thus, electrostatic breakdown does not occur, of course, and the service life of the device hardly decreases.

A second embodiment of the present invention shows an example when a partially changed apparatus having its structure shown in FIG. 7 is applied to a cleaning process before filming an upper layer metal wire in a via hole forming process in which a connection is made between different wire layers of a multilayered wire in a semiconductor device manufacturing process. The difference between the apparatus of FIG. 7 and the apparatus employed in this embodiment is that the plasma generating method is of a microwave discharge type in FIG. 7, whereas the method is of an ICP discharge type in the shown embodiment.

A semiconductor substrate having its structure shown in FIG. 27 is installed on a substrate support base 11 of the shown embodiment. Then, the negative ion generating chamber 19 and the semiconductor substrate treatment chamber 5 are air-evacuated via an air evacuating system, and is pressure-reduced until its degree of vacuum is about $6.7 \times 10^4$ Pa.

Then, a hydrogen gas of 150 sccm is supplied from a process gas introducing port 4, a throttle valve (not shown) installed in the air evacuating system is adjusted, and the pressure of the semiconductor substrate treatment chamber 5 is set to about 1.33 Pa Here, a power of 200 W is supplied from a high-frequency power source to an ICP antenna, and an ICP electric discharge plasma 3 is generated. The generated plasmas are bonded again in a transport tube 24, and is transported downstream by about 50 cm, a majority of which becomes hydrogen radicals, and is supplied to the negative ion producing chamber.

Next, a current of 50 A is supplied to a filament of a heat filament type electron supply device 16, and a voltage of 5 V is applied to a lead-out electrode (not shown) in the electron supply device. In this manner, the thermal electrons emitted from the filament are supplied into a negative ion generating chamber with the energy of about 5 eV. In the negative ion generating chamber, the hydrogen radicals and electrons adhere to each other, and a negative hydrogen ion is generated.

To remove this negative hydrogen ion, a DC voltage of 55 V is applied to the grid 8. Further, a DC voltage of 50 V is applied to the semiconductor substrate support base 11. When the above voltage is applied to the grid, a negative ion of about 50 eV is incident to the semiconductor substrate W with the energy of about 50 eV. In addition, the excessive secondary electron emitted from the substrate is drawn to an electric field of 5 V, and is captured by the grid 8.

After negative hydrogen ion treatment shown above is carried out for about 30 seconds, the substrate maintained in vacuum is moved to the metal wire filming chamber, and the second layer metal wire is deposited. A surface morphology of the deposited film is improved, and the reflection index indicates a value of 210% to the silicon substrate. Subsequently, the second layer metal wire 441 is formed through photo resist patterning and dry etching process.

Thus, when treatment with negative ion only is carried out according to the present invention, a potential of the first layer metal wire is limited to several volts or less, which is an operating voltage of the semiconductor element. Thus, electrostatic breakdown does not occur, of course, and its service life hardly decreases.

Figure 28:
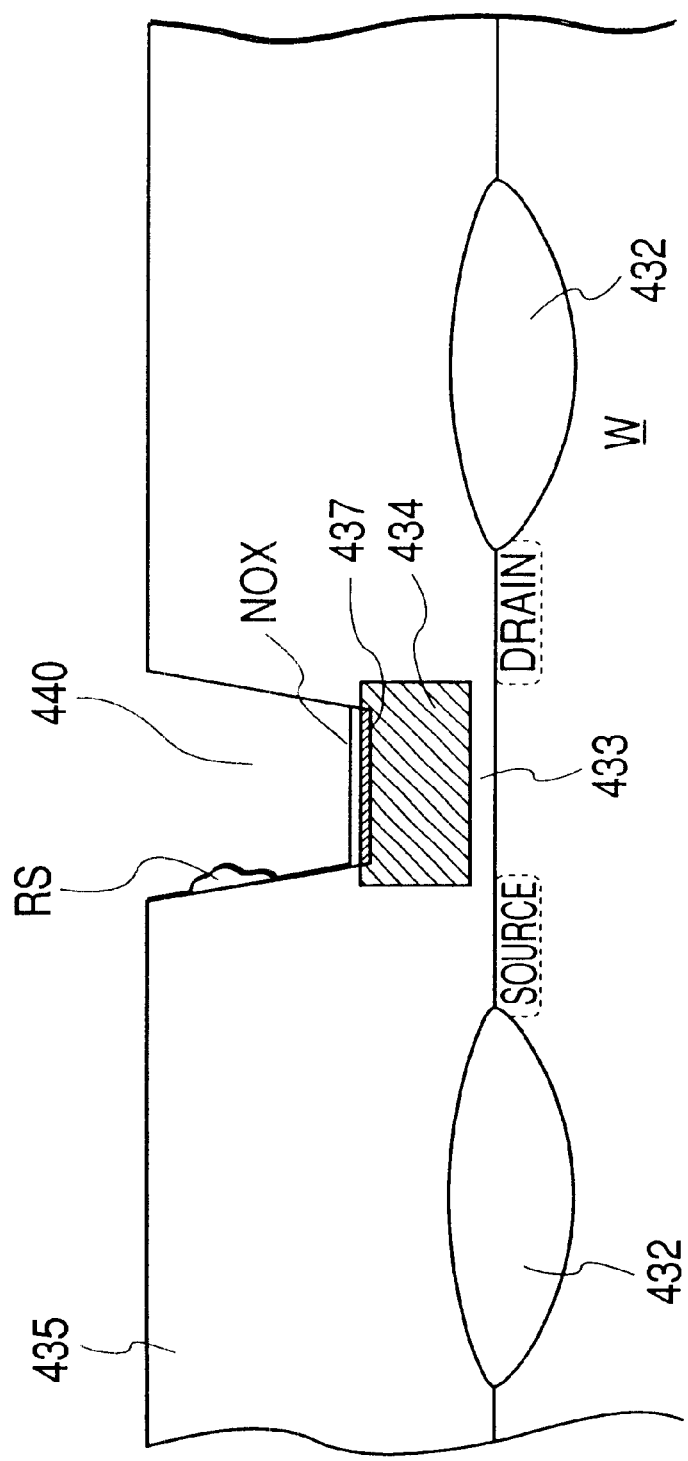
FIG. 28 is a sectional view of the object to be treated according to one preferred embodiment of the present invention.

Next, a treatment method according to another embodiment of the present invention will be described. FIG. 28 shows a structure of a treated element In FIG. 28, W denotes a silicon substrate, reference numeral 432 denotes an element separation oxide film consisting of a silicon heat oxide film, reference numeral 433 denotes a gate oxide film consisting of a silicon heat oxide film of 10 nm in thickness, reference numeral 434 denotes a gate electrode consisting of a polycrystal silicon. Reference numeral 437 denotes a barrier metal, reference numeral 435 denotes a first inter-layer oxide film consisting of a CVD oxide film, reference numeral 440 denotes a contact hole, NOX denotes a barrier metal surface oxide film, and RS denotes a polymer dreg.

A surface treatment device for cleaning having its structure shown in FIG. 10 to FIG. 14 can be employed. Here, for example, an interior wall of a radical generating portion 44 is made of nickel and an interior wall of a negative ion conversion portion 47 is made of an alkaline-earth metal compound with its low work function. In addition, although it is not shown, a cleaning apparatus employed for the shown embodiment is connected to a platform type vacuum treating apparatus provided with an automatic carrying system as shown in FIG. 24, and further, a filming device of the aluminum thin film employing alkyl aluminum hydride and hydrogen is connected to its platform.

First, a substrate of the above structure is installed on a stage 11 of the cleaning apparatus shown in FIG. 10, and air is evacuated until the degree of vacuum in the treatment chamber is $1 \times 10^{-4}$ Pa Next, a temperature of the heater 46 of the radical generating portion 44 shown in FIG. 11 is set to 550° C., and further, the temperature of the negative ion conversion portion 47 is set to 100° C, where a positive bias of +25 V is applied. In the treatment chamber 41, a voltage of +55 V may be applied to the grid 8, and a voltage of +50 V may be applied to the stage 11. A hydrogen gas is introduced from the gas introducing port 43 at a site at which the temperature is stabilized. Although it is not shown, a degree of an opening of a conductance control valve mounted to the air exhaust port 9 is adjusted, and the pressure in the treatment chamber is set to 2 Pa.

The introduced hydrogen gas is converted into hydrogen radicals at a radical generating portion 44. Further, a free electron is received from a metal surface at a negative ion conversion portion 47. Then, a negative hydrogen ion is generated, transported to a treatment chamber, accelerated by a voltage of a grid and a stage, and is impacted on the substrate with the energy of about 25 eV.

While treatment is started in hydrogen gas introduction, after the treatment has been carried out for 90 seconds, a hydrogen gas is stopped, air is evacuated until the degree of vacuum in the treatment chamber is $1\times10^{-4}$ Pa, and cleaning process is ended.

Subsequently, while a substrate is maintained in vacuum, the substrate is carried into a filming device via a platform. In the filming device, the substrate temperature is set to 200° C., a hydrogen gas that is a carrier gas is supplied by 100 sccm, a dimethyl aluminum hydride (DMAH) is bubbled, and filming treatment is carried out for three minutes at a pressure of 100 Pa in treatment chamber.

A cleaning apparatus having its structure shown in FIG. 12, and a radical generating portion having its structure shown in FIG. 13 and FIG. 14 are employed. A plate 40 A of a radical generating portion 44 may be made of nickel, and a member 48 of a negative ion conversion portion 47 may be made of a transition metal compound. In addition, a cleaning apparatus employed for the shown embodiment is connected to a platform type vacuum treatment device provided with an automatic carrying system as shown in FIG. 24. Further, a filming device of an aluminum thin film employing alkyl aluminum hydride and hydrogen is connected to its platform.

First, a substrate having its structure shown above is installed on a cleaning apparatus stage, and air is evacuated until the degree of vacuum in the treatment chamber is $1\times10^{-4}$ Pa. Next, the temperature of the heater 46 of the radical generating portion 44 shown in FIG. 13 and FIG. 14 is set to 550° C., and further, a positive bias of +25 V is applied to the negative ion conversion portion 47 shown in FIG. 12. In the treatment chamber, a voltage of +55 V is applied to the grid, and a voltage of +50 V is applied to the stage. A hydrogen gas is introduced from the gas introducing port 43 at a site at which a temperature is stabilized. Although it is not shown, a degree of an opening of a gate valve mounted at the air evacuating port is adjusted, and the pressure in the treatment chamber is set to 2 Pa.

The introduced hydrogen gas is converted into hydrogen radicals at a radical generating portion 44. Further, a free electron is received from a metal surface at a negative ion conversion portion 47. Then, a negative hydrogen ion is generated, transported to a treatment chamber, accelerated by a voltage of a grid and a stage, and impacted on the substrate with the energy of about 25 eV. While treatment is started in hydrogen gas introduction, after the treatment has been carried out for 30 seconds, a hydrogen gas is stopped, air is evacuated until the degree of vacuum in the treatment chamber is $1\times10^{-4}$ Pa, and the cleaning process is ended.

Subsequently, while a substrate is maintained in vacuum, the substrate is carried to the filming device via a platform. In the filming device, the substrate temperature is set to 200° C., and a hydrogen gas, which is a carrier gas, is supplied by 100 sccm, dimethyl aluminum hydride (DMAH) is bubbled, and filming process is carried out for three minutes under a pressure of 100 Pa in the treatment chamber.

In the above substrate, an aluminum electrode is formed through processes such as photo lithography, dry etching, washing or the like.

EXAMPLE 1

A cross-section structure of a semiconductor substrate treated in the shown Example is the same as that in FIG. 27. In FIG. 27, W denotes a silicon substrate, reference numeral 432 denotes an element separation insulation film, reference numeral 433 denotes a gate oxide film, reference numeral 434 denotes a gate electrode, reference numeral 435 denotes a first inter-layer oxide film, reference numeral 436 denotes a first layer metal wire, reference numeral 437 denotes a barrier metal of the first layer metal wire, reference numeral 438 denotes a reflection proof film of the first layer metal wire, reference numeral 439 denotes a second inter-layer oxide film reference numeral 440 denotes a via hole (a through hole) formed dry etching, and NOX denotes an oxide layer with its thin reflection proof film surface.

Since a natural oxide film or a crystal defect introduced by ion shock during etching remains on a via hole bottom of a silicon substrate surface, if a second layer metal wire is formed as it is, a resistance value of the via hole is increased by the natural oxide film or crystal defect, bringing about a circuit delay or a wire continuity failure. Thus, these residues are required to be eliminated by cleaning. However, if the residues are removed after the cleaning treatment, a natural oxide film grows again on a clean surface. Thus, it is desirable to maintain the residue in vacuum between cleaning and second layer metal wire forming. To meet this requirement, a cleaning method employing plasmas is generally used. The problem is a plasma charge-up phenomenon. When this cleaning is carried out by the conventional positive ion treatment, the positive charge introduced by plasma flows a gate electrode 434 through the first layer metal wire 436, and finally, a voltage is applied to the gate oxide film 433 existing between the silicon substrate W and the gate electrode 434. When this voltage reaches a breakdown voltage, the gate oxide film 433 results in electrostatic breakdown. In addition, even at a breakdown voltage or less, a fine tunnel current flows the gate oxide film 433, thereby substantially reducing its service life.

The substrate shown in FIG. 27 was installed on a substrate support base 11 of the apparatus shown in FIG. 4 Then, a plasma generating chamber 3 and a treatment chamber 5 were air-evacuated via the air evacuating system and pressure-reduced until its degree of vacuum was $6.7\times10$ Pa. Then, a hydrogen gas of 150 sccm was supplied into the plasma generating chamber 3, a throttle valve installed in the air evacuating system was adjusted, and the pressure was set to 1.3 Pa. Here a current of 100 A was supplied from a DC power source 1 to a filament 2, and an arc electric discharge plasma was generated in a plasma generating chamber 3. To remove the negative ion generated by arc electric discharge, a DC voltage of +50 V was applied to a first spare grid 6, and a DC voltage of +75 V was applied to a second spare grid 7. Further a DC voltage of +100 V was applied to a support base 11 and a DC voltage of +105 V was applied to a grid electrode 8. Since a potential in arc electric discharge plasmas was considered to be about several volts, when the above voltage was applied to each grid, a negative ion was incident to the semiconductor substrate W at the energy of about 100 eV. After negative hydrogen ion treatment shown above was carried out for 30 seconds, the substrate maintained in vacuum was moved into a metal wire filming chamber, and the second layer metal wire was deposited. A surface morphology of the deposited film was optimized, and its reflection index indicated a value of 200% to a silicon substrate. Subsequently, a second layer metal wire was formed through photo resist patterning and a dry etching process, and semiconductor element characteristics were evaluated.

When the shown embodiment was employed, there were no elements that degraded performance of the gate oxide film.

Thus, when negative ion treatment was carried out, a potential of the first layer metal wire was limited to several volts or less, which was the operating voltage of the semiconductor element. Thus, electrostatic breakdown does not occur, of course, and the service life is hardly reduced.

EXAMPLE 2

A substrate having its structure shown in FIG. 27 was installed on a support base 11 of the apparatus shown in FIG. 5. Then, a plasma generating chamber 3 and a treatment chamber 5 were air-evacuated via an air evacuating system, and were pressure-reduced until the degree of vacuum was $6.7 \times 10^{-4}$ Pa. Then, a hydrogen gas of 150 sccm was supplied into the plasma generating chamber 3, the throttle valve installed in the air evacuating system was adjusted, and the pressure was set to 10 mTorr. Next, microwaves of 2.45 GHz were supplied from a microwave power source 21 at 500 W, thereby plasmas were generated in the plasma generating chamber 3. The thus generated plasmas were transported on the side of the treatment chamber 5 connected to the plasma generating chamber 3 through the transport tube 24. In the transport tube 24, the positive ion in the plasmas was recombined, and a large amount of neutral active species were generated. The foregoing neutral active species were brought into contact with a −10 V voltage applied metal member 25, which was installed in the treatment chamber 5, and was charge-exchanged, thereby a negative ion was generated. To remove the generated negative ion, a DC voltage of +50 V was applied to a first spare grid 6, and a DV voltage of +75 V was applied to a second spare grid 7. Further, a DC voltage of +100 V was applied to a support base 11, and a DC voltage of +105 V was applied to the grid 8. When the above voltage was applied to each grid, a negative ion was incident to the substrate W at the energy of 110 eV. After negative hydrogen ion treatment shown above was carried out for 30 seconds, the substrate maintained in vacuum was moved to a metal wire filming chamber, and a second layer metal wire was deposited. A surface morphology of the deposited film was optimized and its reflection index indicated a value of 210% to a silicon wafer. Subsequently, a second layer metal wire was formed through photo resist patterning and dry etching process, and the semiconductor element characteristics were evaluated. In the case of the shown Example, there was no element causing degraded performance of the gate oxide film.

EXAMPLE 3

A semiconductor substrate having its structure as shown in FIG. 27 was installed on a support base 11 of the apparatus shown in FIG. 7. Then, a negative ion generating chamber 19 and a semiconductor substrate treatment chamber (treatment space) 5 were air-evacuated via an air-evacuating system, and were pressure-reduced until the degree of vacuum was $5 \times 10^{-6}$ Torr. Then, a hydrogen gas of 150 sccm was supplied from a process gas introducing port 4, a throttle valve (not shown) installed in the air evacuating system was adjusted, and a pressure of a semiconductor substrate treatment chamber 5 was set to about 1.33 Pa. Here, a power of 250 W was supplied from a microwave power source 21 to a wave guide, and a microwave electric discharge plasma 3 was generated.

Next, a current of 50 A was supplied to a filament of a heat filament type electron supply device 16, and further, a voltage of 5 V was applied to a lead-out electrode (not shown) in an electron supply device.

A DC voltage of 55 V was applied to a grid 8, and further, a DC voltage of 50 V was applied to a semiconductor substrate support base 11.

Negative hydrogen ion treatment shown above was carried out for about 30 seconds a substrate maintained in vacuum was moved to a metal wire filming chamber, and a second layer metal wire was deposited. A surface morphology of the deposited film was optimized, and its reflection index indicated a value of 200% to a silicon substrate. Subsequently, the second layer metal wire was formed through photo resist patterning and dry etching process. Such samples were fabricated by 100 pieces, and a charge quantity in which a gate oxide film was to be destroyed was investigated as semiconductor element characteristics. The samples employed in the shown embodiment were an NMOS type capacitor elements having 10 nm in gate oxide film thickness. As a Comparative Example, positive ion cleaning was carried out. The above-mentioned samples were additionally prepared by 100 pieces.

Figure 29A:
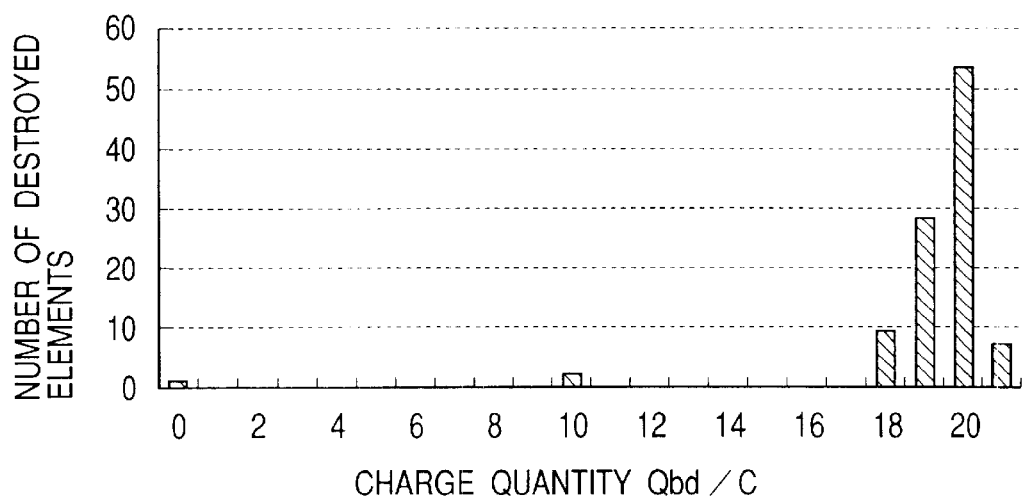
FIGS. 29A and 29B are graphs depicting a relationship between electric charge quantity causing device breakdown and a sample frequency.
Figure 29B:
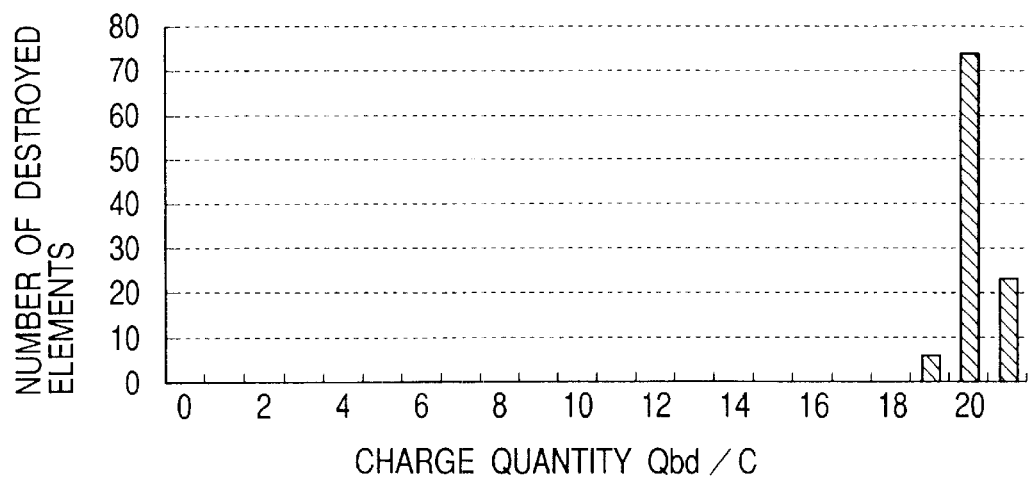
Figure 30:
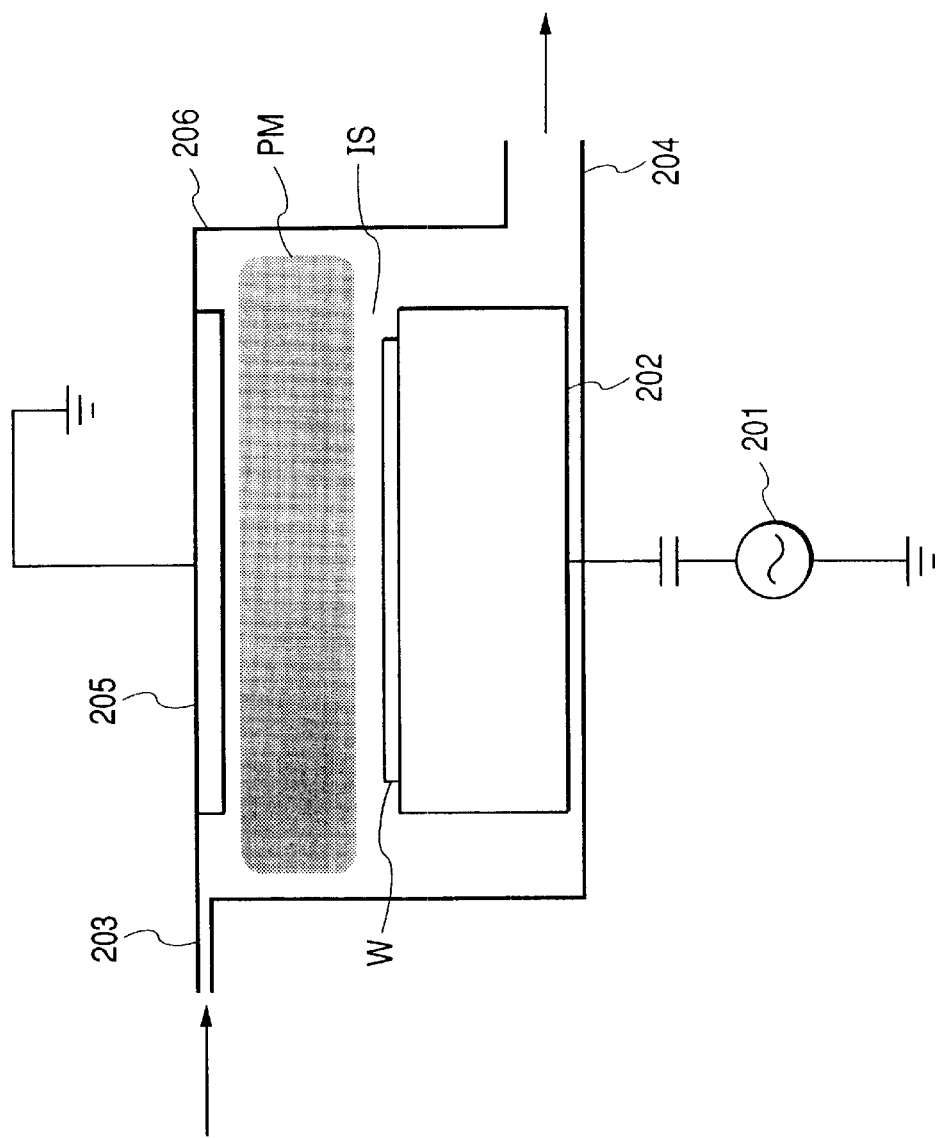
FIG. 30 is a view for illustrating a conventional treating apparatus.

FIGS. 29A and 29B show the results obtained after the gate oxide film of the semiconductor element of which via hole cleaning treatment was carried out was investigated for a charge quantity (Qbd) in which the gate oxide film was destroyed with the method according to the Comparative Example and the shown embodiment. Qbd evaluation means that a charge quantity in which the gate oxide film has been destroyed is measured by supplying a current to a gate electrode via an aluminum electrode formed in a contact hole 440. Qbd of the gate oxide firm indicates a value of about 20 C (coulomb) when the film is free from stress, and the value is gradually lowered by being subjected to stress of charge by plasma treatment. In FIGS. 29A and 29B, a transverse axis denotes a Qbd value, and a longitudinal axis denotes the number of destroyed elements at a certain Qbd value. FIG. 29A shows the deterioration of elements when using positive ions. FIG. 29B shows the deterioration of elements when using negative ions.

EXAMPLE 4

An object to be treated having its structure as shown in FIG. 28 was installed on a stage 11 of a cleaning apparatus shown in FIG. 10, and an air was evacuated until the degree of vacuum in the treatment chamber is $1 \times 10^{-4}$ Pa. Next, the temperature of the heater 46 of a radical generating portion 44 shown in FIG. 11 was set to 550° C., and further, the temperature of the negative ion conversion portion 47 was set to 100° C., where a positive bias of +25 V was applied. In the treatment chamber 41, a voltage of +55 V was applied to the grid 8, and a voltage of +50 V was applied to the stage 11. A hydrogen gas was introduced from a gas introducing port 43 at a site at which a temperature was stabilized. Although it is not shown, a degree of an opening of a conductance control valve mounted on an air exhaust port 9 was adjusted, and the pressure in the treatment chamber was set to 2 Pa.

While processing was started while the hydrogen gas is introduced, after treatment was carried out for 90 seconds, a hydrogen gas was stopped, and the air was evacuated until the degree of vacuum in the treatment chamber was $1 \times 10^{-4}$ Pa again, and cleaning treatment was ended.

Consequently, while a substrate was maintained in vacuum, the substrate was carried to a filming device via a platform. In the filming device, the substrate temperature was set to 200° C., a hydrogen gas being a carrier gas was supplied by 100 sccm, and dimethyl aluminum hydride (DMAH) was bubbled. The filming treatment was carried out under a pressure of 100 Pa in treatment chamber.

After the filming treatment was ended, when a substrate was removed in air, and the surface state was observed, an aluminum thin film was produced only at the center of the substrate, and no filming was found in an area of 30 mm in the vicinity of a substrate.

In the foregoing substrate, after an aluminum electrode was formed only at the center portion through processes such as photo lithography, dry etching, and washing or the like, a charge quantity (Qbd) in which the gate oxide film is destroyed as shown below was evaluated. Qbd evaluation means that a charge quantity in which a gate oxide film 433 is destroyed is measured by supplying a current to a gate electrode 434 via an aluminum electrode formed in a contact hole 440 and on a first inter-layer oxide film 435. Qbd of the gate oxide film indicates a value of about 20 C (coulomb) when the film is free from stress. However, its value is gradually lowered by being subject to stress of charge due to plasma treatment. When Qbd of a transistor fabricated on the treated substrate in the shown Example is measured, all the values are 20 C or more, and no gate oxide film degradation was observed.

EXAMPLE 5

A cleaning apparatus having its structure shown in FIG. 12 and a radical generating portion having its structure shown in FIG. 13 and FIG. 14 were prepared.

First, a substrate having the aforementioned structure was installed on a stage of a cleaning apparatus, and the air was evacuated until the degree of vacuum in the treatment chamber was $1 \times 10^{-4}$ Pa. Next, the temperature of a heater 46 of a radical generating portion was set to 550° C., and further, positive bias of +25 V was applied to a negative ion conversion portion 47. In the treatment chamber, a voltage of +55 V was applied to the grid, and a voltage of +50 V was applied to the stage. A hydrogen gas was introduced from a gas introducing port 43 at a site at which a temperature was stabilized, a degree of an opening of a valve mounted on an air exhaust port 9 was adjusted, and the pressure in the treatment chamber was set to 2 Pa.

While processing was started during the introduction of the hydrogen gas, after treatment was carried out for 30 seconds, a hydrogen gas was stopped, the air was evacuated until the degree of vacuum in the treatment chamber is $1 \times 10^{-4}$ Pa again, and cleaning treatment was ended.

Subsequently, while a substrate was maintained in vacuum, the substrate was carried to a filming device via a platform. In the filming device, the substrate temperature was set to 200° C., a hydrogen gas being a carrier gas was supplied by 100 sccm, dimethyl aluminum hydride (DMAH) was bubbled, and filming treatment was carried out for 3 minutes under a pressure of 100 Pa in the treatment chamber.

In the aforementioned substrate, an aluminum electrode was formed through processes such as photo lithography, dry etching, and washing or the like, and then, a charge quantity (Qbd) in which a gate oxide film was destroyed was evaluated. In the shown Example, 20 C was indicated.

According to the present invention, treatment is carried out by a hydrogen ion group in which a negative hydrogen ion is dominant, thus making it possible to prevent damage due to charging of an object treated and to optimally perform surface treatment such as cleaning, hydrogen termination or the like.

In addition, in the case of an object to be treated having a groove, since a non-uniform charge is not generated in a plane, the shape can be properly maintained, and the inside of the groove can be well treated.

Thus, according to the present invention, damage due to charging is suppressed.

In the claims:

1. A treating apparatus having:
   a container;
   a support means for supporting an object to be treated in the container;
   a gas introducing means for introducing hydrogen gas in the container; and
   a plasma generating means for generating a plasma of the hydrogen gas,
   which comprises a drawing means for preferentially drawing a negative hydrogen ion from the plasma to the object to be treated, wherein a hydrogen ion group in a state in which a negative hydrogen ion quantity is more than a positive hydrogen ion quantity is supplied to the object to be treated for treatment and wherein said plasma generating means is a means for generating arc electric discharge.

2. The treating apparatus as claimed in claim 1, wherein said means for generating arc electric discharge adds at least one kind of metal atom selected from the group consisting of alkali metals and alkaline earth metals during arc electric discharge.

3. The treating apparatus as claimed in claim 2, wherein said group consisting of alkali metals and alkaline-earth metals is a group consisting of cesium, rubidium, barium, strontium, and calcium.

4. The treating apparatus as claimed in claim 1, wherein said drawing means is a bias means for maintaining the object to be treated at a positive potential.

5. The treating apparatus as claimed in claim 1, wherein said drawing means is a grid electrode to be maintained at a positive potential.

6. The treating apparatus as claimed in claim 1, wherein said drawing means is bias means for maintaining the object to be treated at a positive potential, and further comprises a grid electrode for capturing a secondary electron generated from the object to be treated.

7. The treating apparatus as claimed in claim 1, wherein said drawing means comprises a bias means for maintaining the object to be treated at a positive potential and a plurality of grid electrodes maintained at a positive potential.

8. The treating apparatus as claimed in claim 1, wherein the drawing means comprises a plurality of grid electrodes, and biases a grid electrode that is the closest to the object to be treated at a positive maximum potential.

9. The treating apparatus as claimed in claim 1, wherein said treating apparatus is a cleaning apparatus.

10. The treating apparatus as claimed in claim 1, wherein said treating apparatus is a cleaning apparatus for cleaning an inside of a groove formed at the object to be treated.

11. The treating apparatus as claimed in claim 1, wherein said support means is provided upwardly with a grid electrode for capturing a secondary electron emitted from the object to be treated to which a positive voltage is applied.

12. A method for treating an object to be treated by using a treating apparatus of claim 1.

13. The treatment method wherein a negative ion generated by a treating apparatus as claimed in claim 1 is imparted to an object to be treated, thereby performing surface treatment of the object to be treated.

14. A treating apparatus having:
    a container;
    a support means for supporting an object to be treated in the container;
    a gas introducing means for introducing hydrogen gas in the container; and a plasma generating means for generating a plasma of the hydrogen gas, which comprises a metal member for generating a negative hydrogen ion provided so as to come into contact with hydrogen radical and/or positive hydrogen ion generated by the plasma generating means, wherein a hydrogen ion group in a state in which a negative hydrogen ion quantity is more than a positive hydrogen ion quantity is supplied to the object to be treated for treatment, wherein at least a surface of said metal member comprises at least one kind of atom selected from the group consisting of alkali metals and alkaline-earth metals.

15. The treating apparatus as claimed in claim 15, wherein at least a surface of said metal member comprises at least one kind of atom selected from a group consisting of alkali metals and alkaline-earth metals.

16. The treating apparatus as claimed in claim 14 wherein said group consisting of alkali metals and alkaline-earth metals is a group consisting of cesium, rubidium, barium, strontium, and calcium.

17. The treating apparatus as claimed in claim 14, further comprising at least one of a bias means for maintaining the object to be treated at a positive potential and a grid electrode maintained at a positive potential.

18. The treating apparatus as claimed in claim 14, further comprising a bias means for maintaining the object to be treated at a positive potential and a grid electrode for capturing a secondary electron generated from the object to be treated.

19. The treating apparatus as claimed in claim 14, further comprising a bias means for maintaining the object to be treated at a positive potential and a plurality of grid electrodes maintained at a positive potential.

20. The treating apparatus as claimed in claim 14, further comprising a plurality of grid electrodes, wherein the grid electrodes closest to the object to be treated is biased at a maximum of a positive potential.

21. The treating apparatus as claimed in claim 14, wherein said treating apparatus is a cleaning apparatus.

22. The treating apparatus as claimed in claim 14, wherein said treating apparatus is a cleaning apparatus for cleaning an inside of a groove formed at the object to be treated.

23. A method for treating an object to be treated by using a treating apparatus of claim 14.

* * * * *

UNITED STATES PATENT AND TRADEMARK OFFICE
CERTIFICATE OF CORRECTION

PATENT NO.    : 6,511,575 B1
DATED         : January 28, 2003
INVENTOR(S)   : Haruo Shindo et al.

It is certified that error appears in the above-identified patent and that said Letters Patent is hereby corrected as shown below:

Title page,
Item [57], ABSTRACT,
Line 2, "all" should read -- an --.

Column 2,
Line 23, "CVD)" should read -- CVD --.

Column 3,
Line 29, "container," should read -- container; --; and
Line 31, "container," should read -- container; --.

Column 6,
Line 5, "22C and 22D" should read -- 21C and 21D --; and
Line 8, "FIGS. 22" should read -- FIG. 22 --.

Column 7,
Line 5, "discharge" should read -- discharge. --;
Line 34, (close up right margin); and
Line 35, (close up left margin).

Column 8,
Line 37, "treated" should read -- treated. --.

Column 9,
Line 51, "suffice" should read -- suffice. --.

Column 10,
Line 41, "surface" (second occurrence) should read -- type, surface --; and
Line 42, "with a" should read -- with --.

Column 11,
Line 47, "microwave-electric" should read -- microwave electric --; and
Line 48, "source. It" should read -- source, it --.

Column 13,
Line 17, "W" should read -- W. --;
Line 23, "11" should read -- 11, --;
Line 45, "provide" should read -- provides --; and
Line 59, "above mentioned" should read -- above-mentioned --.

UNITED STATES PATENT AND TRADEMARK OFFICE
CERTIFICATE OF CORRECTION

PATENT NO. : 6,511,575 B1
DATED : January 28, 2003
INVENTOR(S) : Haruo Shindo et al.

It is certified that error appears in the above-identified patent and that said Letters Patent is hereby corrected as shown below:

Column 14,
Line 43, "FIG. 10A" should read -- FIG. 10. A --.

Column 15,
Line 2, "CaB," should read -- $CaB_6$ --;
Line 8, "beated" should read -- heated --;
Line 33, "structure" should read -- structure. --; and
Line 57, "function" should read -- function. --.

Column 16,
Line 48, "Hf;" should read -- Hf, --; and "Jr," should read -- Ir, --;
Line 54, "AlCaGe," should read -- AlCuGe --; and
Line 56, "TaSi." should read -- TaSi, --.

Column 17,
Line 15, "deposited" should read -- deposited. --;
Line 19, "embodiment" should read -- embodiment, --;
Line 21, "with out" should read -- without --;
Line 34, "tungsten" should read -- tungsten, --; and
Line 45, "61" should read -- 61, --.

Column 18,
Line 12, "density" should read -- density. --;
Line 35, "apart" should read -- a part --; and
Line 46, "remain," should read -- remains, --.

Column 20,
Line 15, "Making" should read -- making --; and
Line 40, "groove," should read -- groove; --.

Column 21,
Line 38, "WSi." should read -- WSi, --.

Column 22,
Line 29, "200°C," should read -- 200°C., --;
Line 42, "is" should read -- are --;
Line 44, "improved. The" should read -- improved. ¶ The --; and
Line 47, "108" should read -- 108, --.

UNITED STATES PATENT AND TRADEMARK OFFICE
CERTIFICATE OF CORRECTION

PATENT NO.    : 6,511,575 B1
DATED         : January 28, 2003
INVENTOR(S)   : Haruo Shindo et al.

It is certified that error appears in the above-identified patent and that said Letters Patent is hereby corrected as shown below:

Column 23,
Line 1, "formed" should read -- formed. --;
Line 2, "formed." should read -- formed --;
Line 8, "153" should read -- 153. --; and
Line 45, "FIGS." should read -- FIG. --.

Column 24,
Line 36, "mas" should read -- mas. --; and
Line 51, "6.7x104" should read -- $6.7 \times 10^{-4}$ --.

Column 25,
Line 45, "6.7x104" should read -- $6.7 \times 10^{-4}$ --; and
Line 50, "Pa" should read -- Pa. --.

Column 26,
Line 22, "element" should read -- element. --; and
Line 49, Pa" should read -- Pa. --.

Column 28,
Line 32, "4" should read -- 4. --; and
Line 35, "6.7x10" should read -- $6.7 \times 10^{-4}$ --.

Column 30,
Line 2, "seconds" should read -- seconds, --.

Column 33,
Lines 13-16,
"15. The treating apparatus as claimed in claim 15, wherein at least a surface of said metal member comprises at least one kind of atom selected from the group consisting of alkali metals and alkaline-earth metals."

should read

-- 15. The treating apparatus as claimed in claim 14, wherein said plasma generating means is an electric energy supply means of any of parallel plate type, magnetron type, ICP type, ECR type, helicon-wave type, surface wave type, surface wave interference type using flat plate multi-slot antenna, and RLSA type. --; and

UNITED STATES PATENT AND TRADEMARK OFFICE
CERTIFICATE OF CORRECTION

PATENT NO.    : 6,511,575 B1
DATED         : January 28, 2003
INVENTOR(S)   : Haruo Shindo et al.

It is certified that error appears in the above-identified patent and that said Letters Patent is hereby corrected as shown below:

Column 33 cont'd,
Line 17, "14" should read -- 14, --.

Signed and Sealed this

Thirtieth Day of December, 2003

JAMES E. ROGAN
*Director of the United States Patent and Trademark Office*